United States Patent [19]
Oishi et al.

[11] Patent Number: 5,818,303
[45] Date of Patent: Oct. 6, 1998

[54] FRACTIONAL N-FREQUENCY SYNTHESIZER AND SPURIOUS SIGNAL CANCEL CIRCUIT

[75] Inventors: Kazuaki Oishi; Kimitoshi Niratsuka, both of Kawasaki, Japan

[73] Assignee: Fujitsu Limited, Kanagawa, Japan

[21] Appl. No.: 899,762

[22] Filed: Jul. 24, 1997

[30] Foreign Application Priority Data

Nov. 21, 1996 [JP] Japan ............................ 8-310922

[51] Int. Cl.⁶ .................................................. H03L 7/197
[52] U.S. Cl. ........................ 331/1 A; 331/10; 331/16; 331/17; 331/25
[58] Field of Search ........................ 331/1 A, 10, 17, 331/25, 16

[56] References Cited

U.S. PATENT DOCUMENTS

| | | | |
|---|---|---|---|
| 4,586,005 | 4/1986 | Crawford | 331/1 A |
| 5,180,993 | 1/1993 | Dent | 331/1 A |

OTHER PUBLICATIONS

"High Speed Switching Fractional–N Synthesizer Using Phase Error Compensation Scheme with Controlling Pulse Width", Hirata et al, *Technical Report of IEICE*, RCS95–119, (Jan. 1996), pp. 51–55.

*Primary Examiner*—Siegfried H. Grimm
*Attorney, Agent, or Firm*—Nikaido, Marmelstein, Murray & Oram LLP

[57] ABSTRACT

A fractional N-frequency synthesizer includes an accumulator outputting an output value, and a spurious signal cancel circuit. The spurious signal cancel circuit includes a pulse forming circuit, receiving a spurious signal cancelling reference signal, a reset signal and the output value of the accumulator, and outputting, in synchronism with the spurious signal cancelling reference signal, a pulse voltage signal having a pulse width proportional to the output value of the accumulator from a time when the reset signal is received, and a constant current circuit controlled by the pulse voltage signal and outputting an output current of the spurious signal cancel circuit.

30 Claims, 31 Drawing Sheets

5,818,303

FRACTIONAL N-FREQUENCY SYNTHESIZER AND SPURIOUS SIGNAL CANCEL CIRCUIT

BACKGROUND OF THE INVENTION

The present invention generally relates to fractional N-frequency synthesizers and spurious signal cancel circuits, and more particularly to a fractional N-frequency synthesizer in which a frequency division of a phase locked loop (PLL) frequency synthesizer periodically changes and to a spurious signal cancel circuit which forms such a fractional N-frequency synthesizer.

First, a description will be given of a PLL frequency synthesizer.

FIG. 1 is a system block diagram showing the construction of the PLL frequency synthesizer. In FIG. 1, Vcc denotes a power supply voltage. A phase comparator 3 receives a reference signal fr which is output from a frequency divider 2-1 in response to a signal fosc. The phase comparator 3 also receives a comparison signal fp which is obtained by frequency-dividing an output signal fo of a voltage controlled oscillator (VCO) 1 by a frequency divider 2-2. The phase comparator 3 detects a phase error between the comparison signal fp and the reference signal fr, and supplies to a charge pump circuit 4 a voltage pulse having a pulse width dependent on this phase error. The charge pump circuit 4 outputs a charge pump output current Icp which assumes one of three states including a current pump-out state, a current pump-in state and a high-impedance state. This charge pump output current Icp is smoothened and converted into a voltage by a loop filter 5, and the VCO 1 receives the output voltage of the loop filter 5 as a control voltage. The output signal fo of the VCO 1 is frequency divided by N, that is, multiplied by 1/N, by the frequency divider 2-2, and is fed back to the phase comparator 3 as the comparison signal fp. Accordingly, a frequency fo of the output signal fo of the VCO 1 can be described by the following formula (1), where N denotes the frequency dividing factor of the frequency divider 2-2 and fr denotes a frequency of reference signal fr.

$$fo = N \times fr \tag{1}$$

Therefore, the PLL frequency synthesizer can obtain the output signal fo having a frequency which is an integral multiple of (N times) the frequency fr of the reference signal fr. For this reason, it is possible to switch the output signal frequency fo at intervals of fr by switching the integer N.

In the PLL frequency synthesizer described above, the output signal frequency fo must reach and lock to the frequency described by the above formula (1) as quickly a possible when the integer N is switched. It is necessary to increase the reference signal frequency fr in order to improve the lock-up characteristic of the PLL frequency synthesizer.

However, the interval at which the output signal frequency fo can be switched is fr, as described above. Consequently, if the reference signal frequency fr is increased in order to improve the lock-up characteristic, the frequency interval of the output signal fo that can be switched increases. In a communication unit in which the frequency band is determined in advance, the increase of the frequency interval of the output signal fo that can be switched results in the decrease of the number of frequencies that can be used, that is, the decrease of the number of bands.

In order to solve the above problem, there is a known fractional N-frequency synthesizer which can switch the output signal frequency fo at an interval smaller than the reference signal frequency fr.

FIG. 2 is a system block diagram showing the construction of the fractional N-frequency synthesizer. In FIG. 2, those parts which are essentially the same as those corresponding parts in FIG. 1 are designated by the same reference numerals, and a description thereof will be omitted.

The fractional N-frequency synthesizer shown in FIG. 2 includes an accumulator 6 and a spurious signal cancel circuit 7 in addition to the elements forming the PLL frequency synthesizer shown in FIG. 1. For every comparison period, the accumulator 6 obtains a sum of a held value acm which is held by the accumulator 6 one comparison period before and an input binary data F, based on a clock CLK having the same period as the comparison period, where the comparison period is the period of the reference signal fr or the comparison signal fp. Hence, the held value acm of the accumulator 6 is incremented by F for every comparison period. If the accumulator 6 has a n-bit structure, an overflow occurs when the held value acm becomes greater than or equal to $2^n$, and an overflow signal Sov is output with respect to the frequency divider 2-2. The normal frequency dividing factor N of the frequency divider 2-2 is changed to N+1 during the comparison period in which the overflow signal Sov is detected. In other words, the frequency dividing factor of the frequency divider 2-2 becomes N+1 F times during $2^n$ comparison periods.

Accordingly, the output signal frequency fo of the VCO 1 becomes fo1=(N+1)×fr F times during $2^n$ comparison periods, and becomes fo2=N×fr $2^n$−F times during the $2^n$ comparison periods. Thus, an average output signal frequency fo of the VCO 1 can be described by the following formula (2).

$$\begin{aligned} fo &= (N+1) \times fr \times F/2^n + N \times fr(2^n - F)/2^n \\ &= fr \times \{N + (F/2^n)\} \end{aligned} \tag{2}$$

That is, it is possible to switch the average output signal frequency fo of the VCO 1 at a frequency lower than the reference signal frequency fr by switching not only N by also F.

When the accumulator 6 is merely added to the PLL frequency synthesizer, the average output signal frequency of the VCO 1 becomes as described by the above formula (2). However, the actual output signal fo of the VCO 1 constantly fluctuates between the frequency fo1=(N+1)×fr F and the frequency fo2=N×fr. Consequently, when the frequency spectrum of the output signal fo of the VCO 1 is observed, spurious signals are generated at positions shifted by m×(fr/$2^n$) from the center frequency, where m=1, 2, . . .

FIG. 3 is a diagram showing the frequency spectrum of the output signal fo of the VCO 1. In FIG. 3, the ordinate indicates the level in arbitrary units, and the abscissa indicates the frequency. FIG. 3 shows the frequency spectrum for a case where the reference signal frequency fr is 200 kHz and the accumulator 6 has a 3-bit structure. As may be seen from FIG. 3, spurious signals are generated at positions shifted from the center frequency $f_0$ by an integral multiple of fr/$2^n$=25 kHz.

In order to prevent the generation of such spurious signals, it is necessary to fix the output signal frequency fo of the VCO 1 to a constant frequency between the frequency fo1=(N+1)×fr and the frequency fo2=N×fr. For this reason, the fractional N-frequency synthesizer is provided with the spurious signal cancel circuit 7 shown in FIG. 2.

The conventional spurious signal cancel circuit 7 shown in FIG. 2 includes a digital-to-analog (D/A) converter 10 which inputs the held value acm of the accumulator 6 and converts this held value acm into an analog current value.

FIGS. 4(A) through 4(F) are timing charts for explaining the operating principle of the spurious signal cancel circuit 7. FIGS. 4(A) through 4(F) show signals at various parts of the spurious signal cancel circuit 7 for a case where the accumulator 6 has a 3-bit structure such that the held value acm may take a value in a range 0, 1, . . . , 7, and the input binary data F is F=2.

FIG. 4(A) shows the reference signal fr, and FIG. 4(B) shows the comparison signal fp. FIG. 4(C) shows the overflow signal Sov output from the accumulator 6, and FIG. 4(D) shows the output current Icp of the charge pump circuit 4. In addition, FIG. 4(E) shows an output current Isc of the D/A converter 10, and FIG. 4(F) shows an output current Do supplied to the loop filter 5.

In this case, the held value acm of the accumulator 6 is incremented by F=2 for every comparison period, and accordingly changes as 0, 2, 4, 6, 0, 2, . . . for each of the comparison periods (0), (1), (2), (3), (4), (5), . . . As a result, an overflow of the accumulator 6 occurs once for every 4 comparison periods, that is, at the comparison periods (0), (4), (8), . . . , and the overflow signal Sov shown in FIG. 4(C) is output from the accumulator 6 when the overflow occurs. The frequency dividing factor of the frequency divider 2-2 is set to N, but changes to N+1 at the comparison periods (0), (4), (8), . . . when the overflow signal Sov is detected. Hence, if the spurious signal cancel circuit 7 were not provided, the output signal frequency fo of the VCO 1 would fluctuate between the frequency fo1=(N+1)×fr and the frequency fo2=N×fr and the spurious signals shown in FIG. 3 would be generated.

However, the fractional N-frequency synthesizer shown in FIG. 2 is provided with the spurious signal cancel circuit 7 which includes the D/A converter 10. As shown in FIG. 4(E), the spurious signal cancel circuit 7 generates the output current Isc of the D/A converter 10 which has a magnitude proportional to the output value (held value) acm of the accumulator 6, and superimposes this output current Isc on the output current Icp of the charge pump circuit 4. A superimposed output current Do has a waveform shown in FIG. 4(F). This output current Do is smoothened and converted into a voltage by the loop filter 5, and the output voltage of the loop filter 5 is supplied to the VCO 1 as the control voltage.

As shown in FIG. 4(D), the output current Icp of the charge pump circuit 4 shows a periodic change, thereby causing the spurious signals. As shown in FIG. 4(E), the output current Isc of the D/A converter 10 is output in a direction opposite to the output current Icp of the charge pump circuit 4. If the area of the waveform of the output current Icp of the charge pump circuit 4 shown in FIG. 4(D) and the area of the waveform of the output current Isc of the D/A converter 10 shown in FIG. 4(E) are the same, it is possible to cancel the periodic change of the output current Icp of the charge pump circuit 4 and to reduce the spurious signals as shown in FIG. 4(F) by adding the output current Isc of the D/A converter 10 to the output current Icp of the charge pump circuit 4.

According to the conventional fractional N-frequency synthesizer described above, the fluctuation of the control voltage supplied to the VCO 1 is suppressed by cancelling the output current Icp of the charge pump circuit 4 by the output current Isc of the D/A converter 10. For this reason, it is necessary to accurately control the value of the output current Isc of the D/A converter 10 with respect to the output current Icp of the charge pump circuit 4.

In order to improve the accuracy of the D/A converter 10 of the fractional N-frequency synthesizer, it is conceivable to provide a decoder 89 and $2^n$ constant current circuits 87 which have identical characteristics and output currents having identical values at an output part of the D/A converter 10 as shown in FIG. 5. However, the $2^n$ constant current circuits 87 would occupy a large area, thereby increasing the circuit scale of the D/A converter 10.

In addition, it would be difficult to accurately control the characteristics of the $2^n$ constant current circuits 87 with respect to the output current Icp of the charge pump circuit 4. As a result, the value of the output current Isc of the D/A converter 10 would inevitably be greater than or less than an anticipated value with respect to the output current Icp of the charge pump circuit 4. Therefore, there conventionally was a limit to cancelling the spurious signals, and there was a limit to the accuracy with which the spurious signals can be cancelled even in the case of the conceivable circuit shown in FIG. 5. In other words, there was a problem in that it is difficult to completely cancel the spurious signals generated in the frequency spectrum of the output signal fo of the VCO 1.

SUMMARY OF THE INVENTION

Accordingly, it is a general object of the present invention to provide a novel and useful fractional N-frequency synthesizer and a spurious signal cancel circuit, in which the problems described above are eliminated.

Another and more specific object of the present invention is to provide a fractional N-frequency synthesizer comprising an accumulator outputting an output value, and a spurious signal cancel circuit comprising a pulse forming circuit, receiving a spurious signal cancelling reference signal, a reset signal and the output value of the accumulator, and outputting, in synchronism with the spurious signal cancelling reference signal, a pulse voltage signal having a pulse width proportional to the output value of the accumulator from a time when the reset signal is received, and a constant current circuit controlled by the pulse voltage signal and outputting an output current of the spurious signal cancel circuit. According to the fractional N-frequency synthesizer of the present invention, only one constant current circuit is required as compared to the conventional case where a plurality of constant current circuits are required, thereby making it possible to greatly reduce the scale of the circuit. In addition, it is easier to control the output current of the spurious signal cancel circuit with respect to an output current of a charge pump circuit. Furthermore, since the pulse width and not the current value of the output current of the spurious signal cancel circuit is accurately controlled digitally with respect to the held value of the accumulator, it is possible to improve the accuracy of the spurious signal cancel process.

Still another object of the present invention is to provide a spurious signal cancel circuit for a fractional N-frequency synthesizer which includes an accumulator outputting an output value, comprising a pulse forming circuit, receiving a spurious signal cancelling reference signal, a reset signal and the output value of the accumulator, and outputting, in synchronism with the spurious signal cancelling reference signal, a pulse voltage signal having a pulse width proportional to the output value of the accumulator from a time when the reset signal is received, and a constant current circuit controlled by the pulse voltage signal and outputting an output current of the spurious signal cancel circuit. According to the spurious signal cancel circuit of the present invention, only one constant current circuit is required as compared to the conventional case where a plurality of constant current circuits are required, thereby making it possible to greatly reduce the scale of the circuit. In addition, it is easier to control the output current of the spurious signal cancel circuit with respect to an output current of a charge pump circuit. Furthermore, since the pulse width and not the current value of the output current of the spurious signal cancel circuit is accurately controlled digitally with respect to the held value of the accumulator, it is possible to improve the accuracy of the spurious signal cancel process.

Other objects and further features of the present invention will be apparent from the following detailed description when read in conjunction with the accompanying drawings.

DESCRIPTION OF THE PREFERRED EMBODIMENTS

First, a description will be given of the operating principle of the present invention, by referring to FIGS. 6A through 8.

Figure 6A:
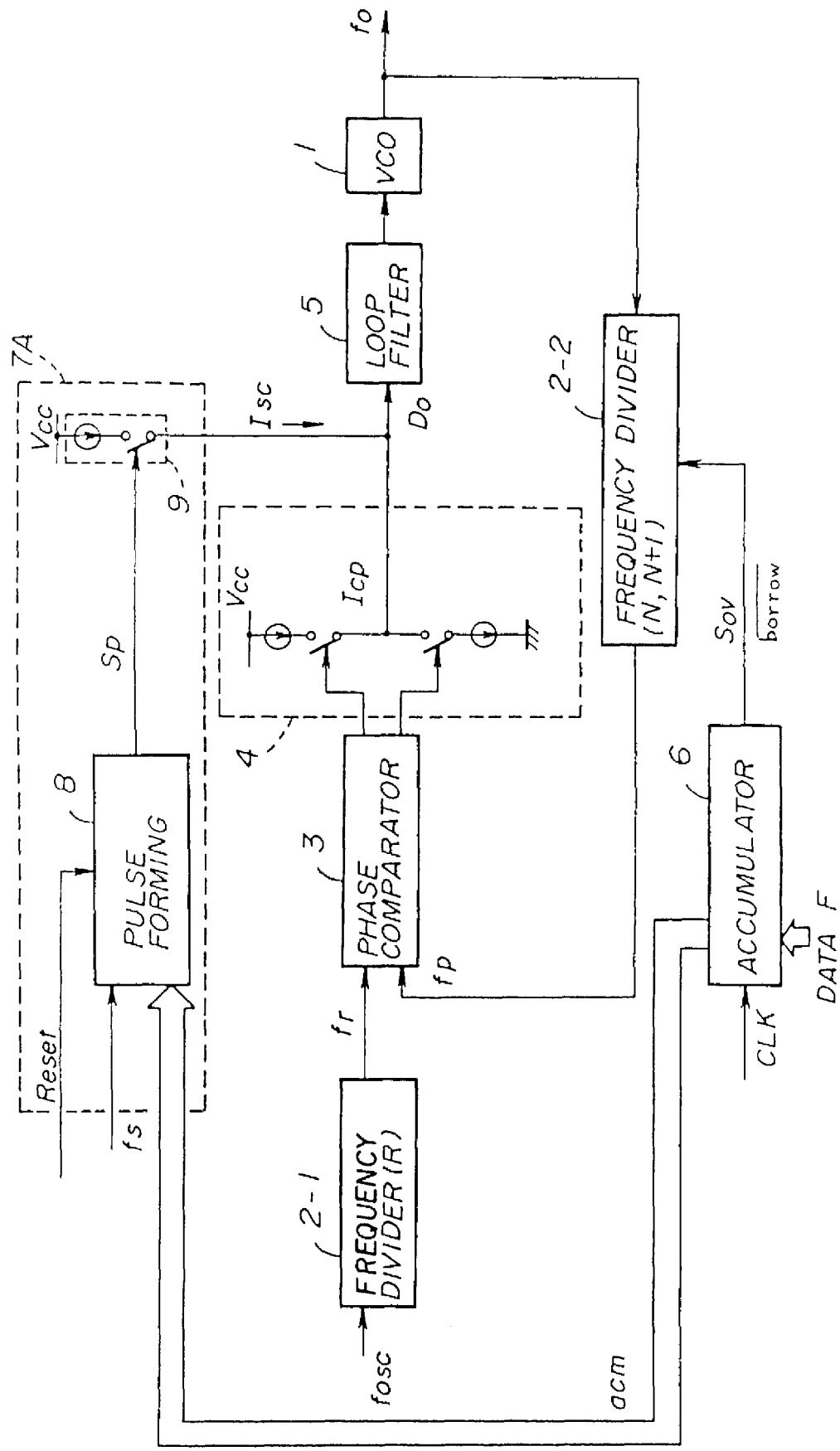
FIG. 6A is a system block diagram for explaining the operating principle of the present invention.
Figure 6B:
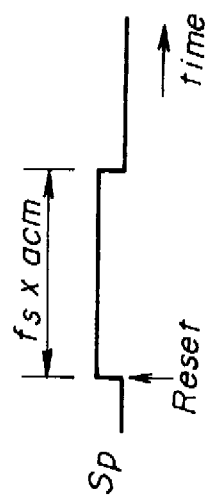
FIG. 6B is a diagram showing an output pulse voltage signal of a pulse forming circuit.
Figure 7:
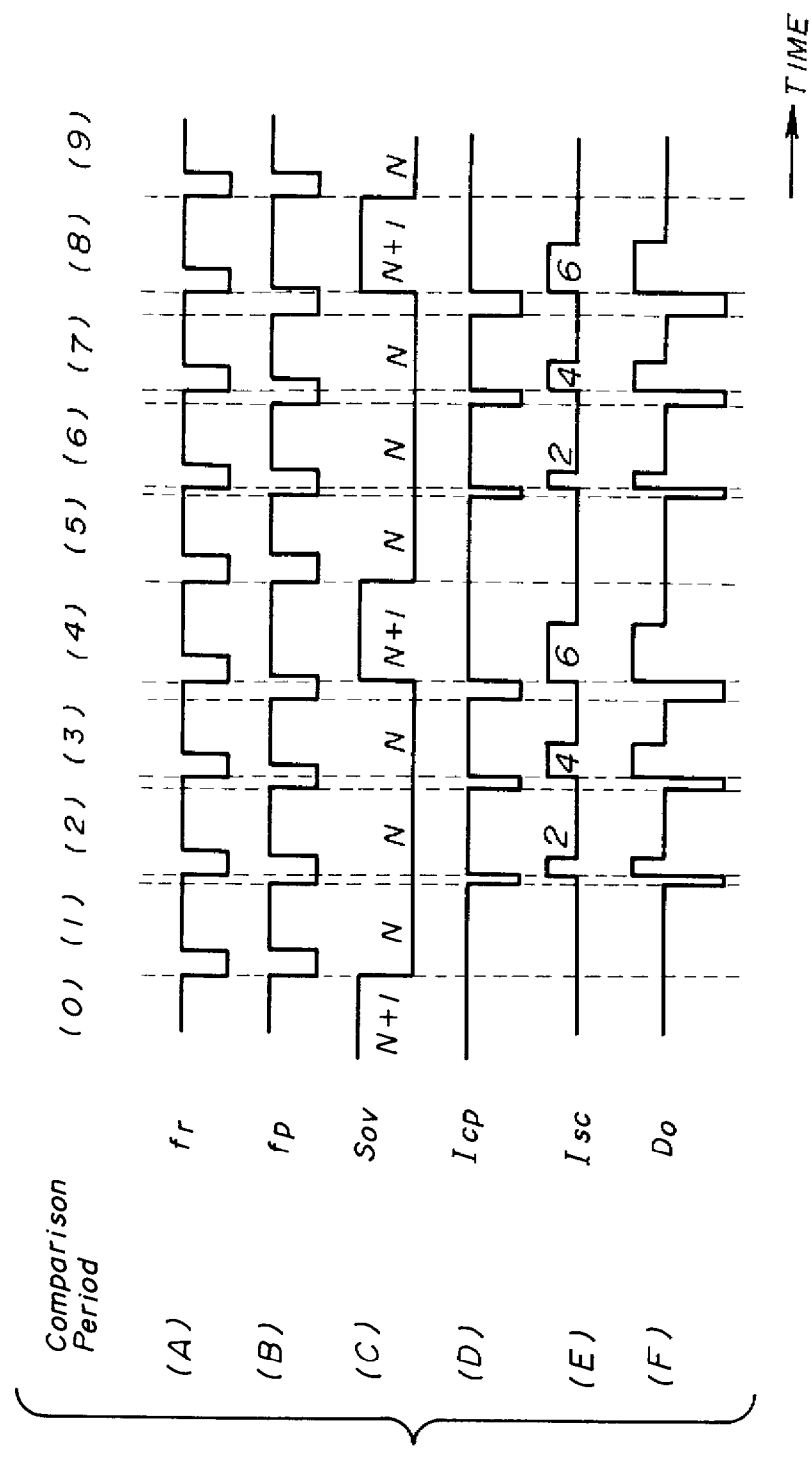
FIG. 7 shows timing charts for explaining the operating principle of the present invention.

FIG. 6A is a system block diagram for explaining the operating principle of the present invention. In FIG. 6A, those parts which are essentially the same as those corresponding parts in FIG. 2 are designated by the same reference numerals, and a description thereof will be omitted.

Figure 1:
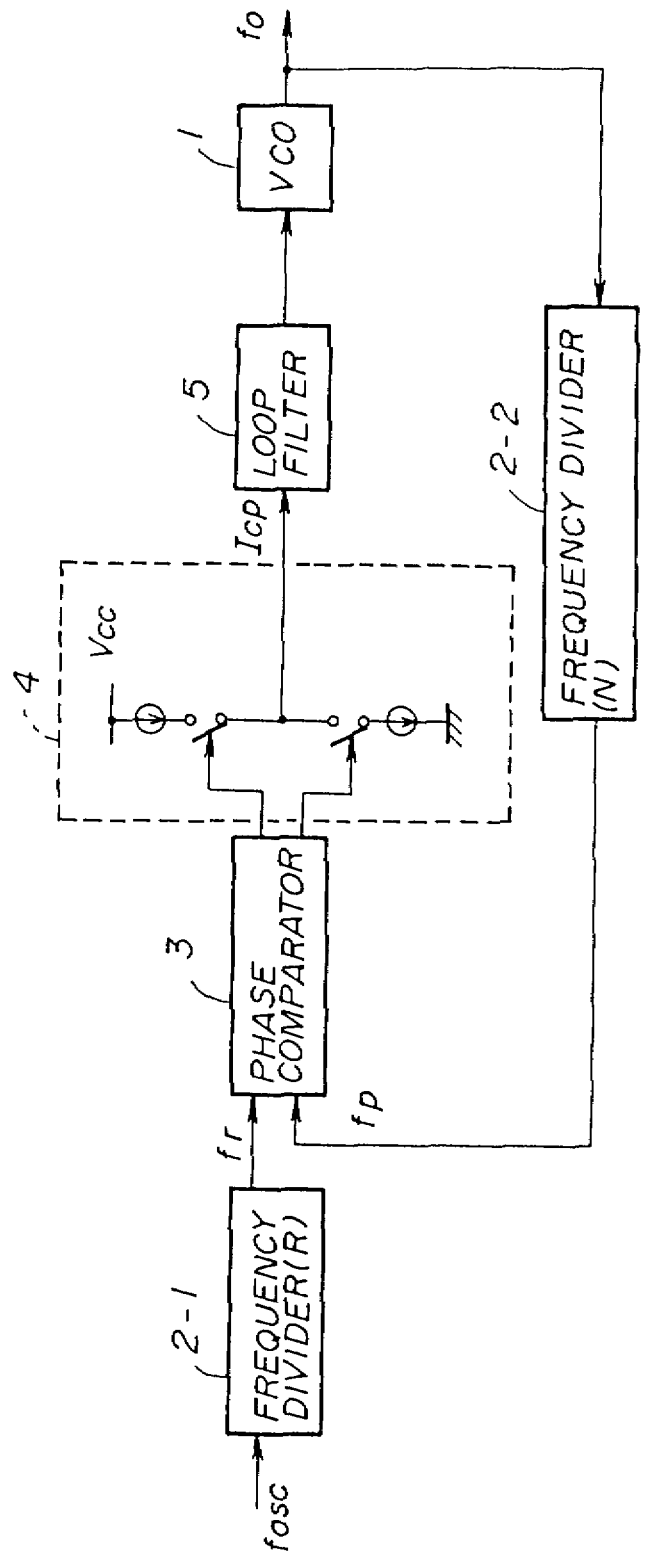
FIG. 1 is a system block diagram showing the construction of a conventional PLL frequency synthesizer.
Figure 2:
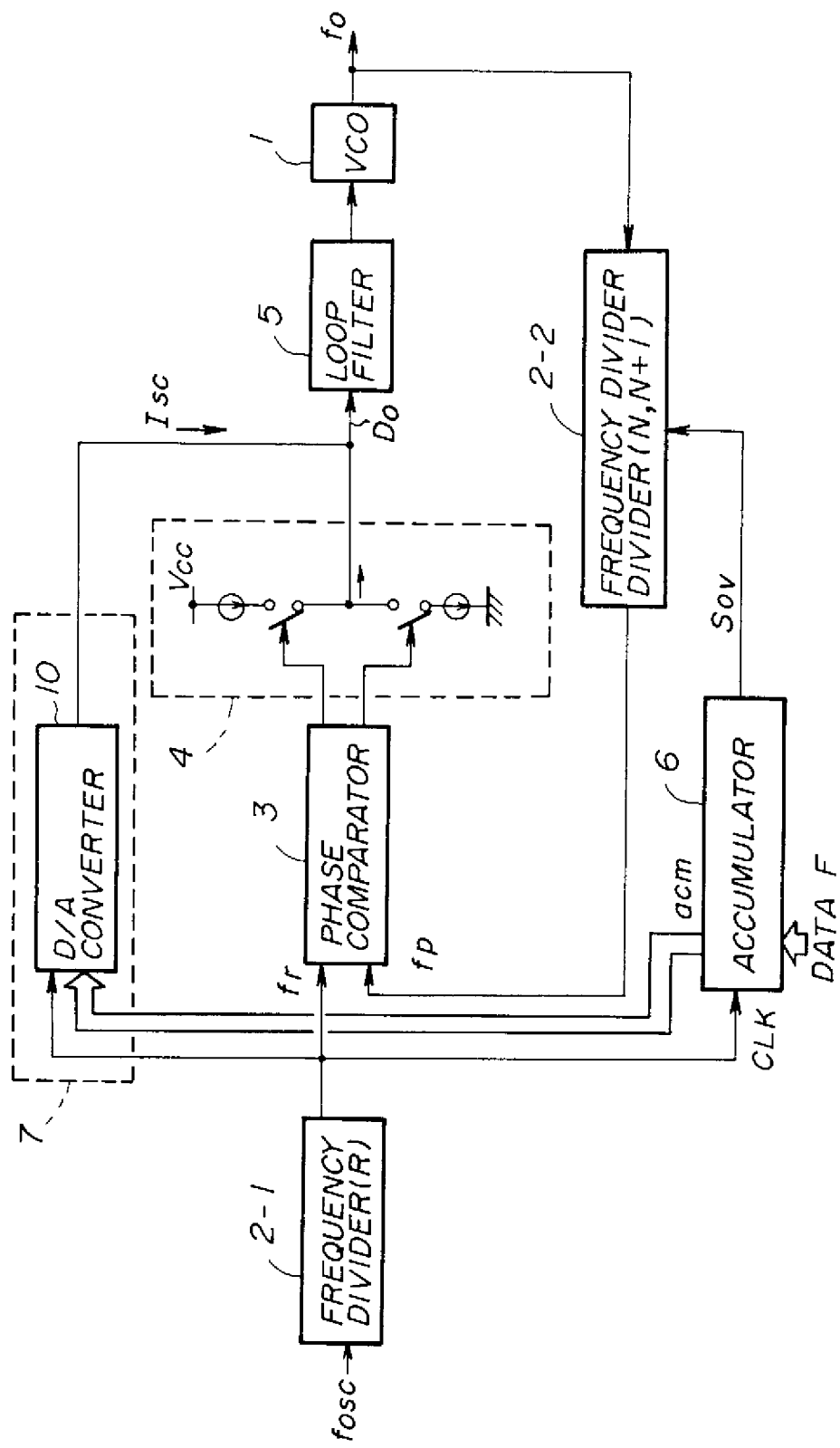
FIG. 2 is a system block diagram showing the construction of a conventional fractional N-frequency synthesizer.

In the conventional fractional N-frequency synthesizer shown in FIG. 2, the spurious signal cancel circuit 7 includes the D/A converter 10. on the other hand, in a fractional N-frequency synthesizer according to the present invention shown in FIG. 6A, a spurious signal cancel circuit 7A includes a pulse forming circuit 8 and a single constant current circuit 9 which is driven and controlled by the pulse forming circuit 8.

FIGS. 7(A) through 7(F) are timing charts for explaining the operating principle of the present invention. FIG. 7(A) shows a reference signal fr, FIG. 7(B) shows a comparison signal fp, and FIG. 7(C) shows an overflow signal Sov of an accumulator 6. In addition, FIG. 7(D) shows an output current Icp of a charge pump circuit 4, FIG. 7(E) shows an output current Isc of the spurious signal cancel circuit 7A, and FIG. 7(F) shows an output current Do which is supplied to a loop filter 5.

Figure 8:
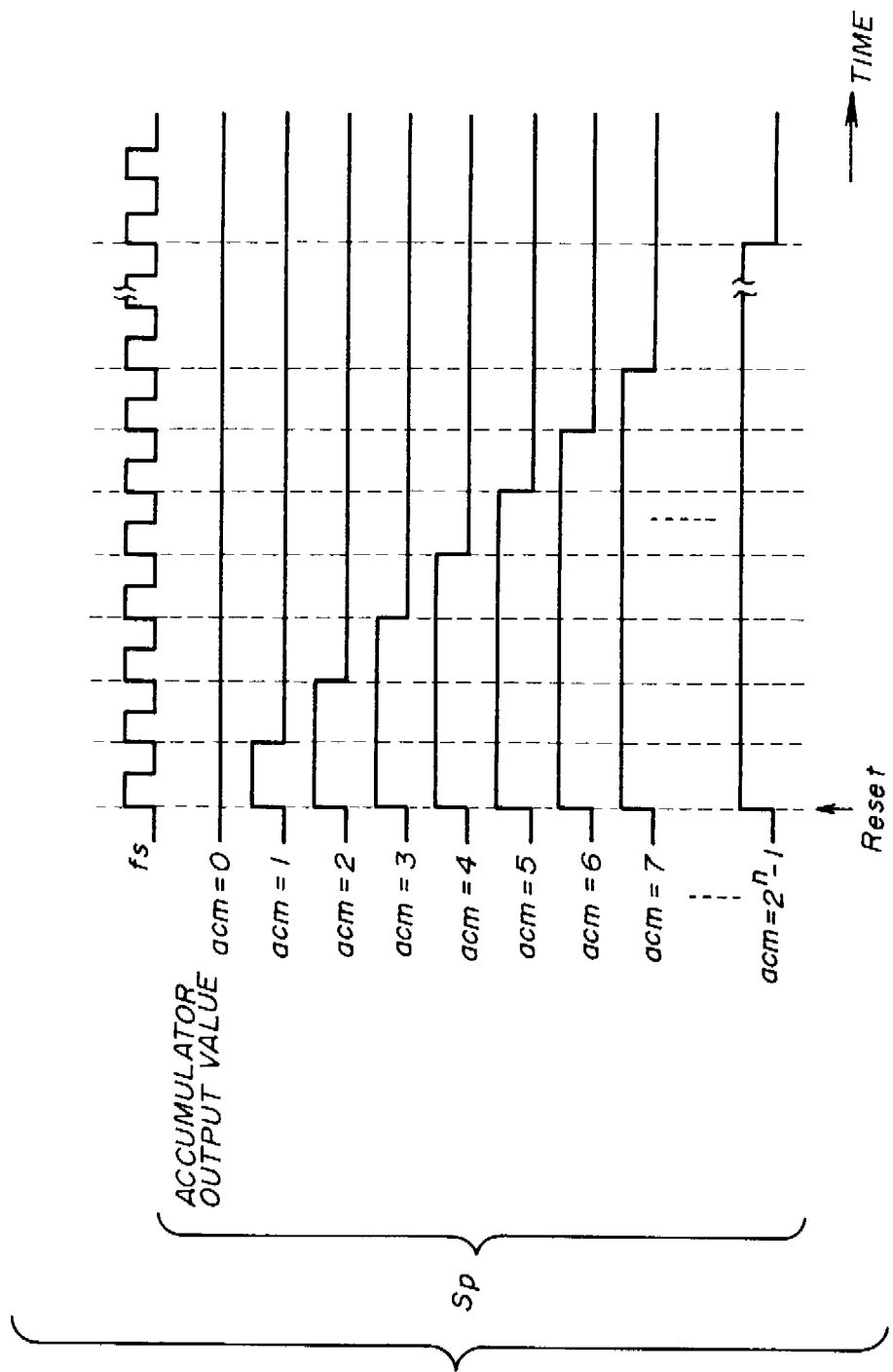
FIG. 8 is a timing chart for explaining a pulse voltage signal used in the present invention.

A spurious signal cancelling reference signal fs, a reset signal Reset, and an output value acm of the accumulator 6 are input to the pulse forming circuit 8. The pulse forming circuit 8 generates a pulse voltage signal Sp shown in FIG. 6B which rises simultaneously as when the reset signal Reset is input, in synchronism with the spurious signal cancelling reference signal fs, and has a pulse width proportional to the output value acm of the accumulator 6, as shown in FIG. 8. The constant current circuit 9 is driven and controlled by this pulse voltage signal Sp, and the constant current circuit 9 outputs a constant current having a pulse width proportional to the output value acm of the accumulator 6, that is, the output current Isc of the spurious signal cancel circuit 7A shown in FIG. 7(E).

The output current Isc of the spurious signal cancel circuit 7A, obtained from the constant current circuit 9, is superimposed on the output current Icp of the charge pump circuit 4 shown in FIG. 7(D), thereby forming the output current Do shown in FIG. 7(F). As will be described later, this output current Do functions to cancel the spurious signals.

The spurious signal cancel process of the present invention will now be described with reference to FIGS. 7(A) through 7(F). FIGS. 7(A) through 7(F) are timing charts for explaining the operating principle of the present invention. FIGS. 7(A) through 7(F) show signals at various parts of the spurious signal cancel circuit 7A for a case where the accumulator 6 has a 3-bit structure such that the held value acm make take a value in a range 0, 1, ..., 7, and the input binary data F is F=2.

FIG. 7(A) shows a reference signal fr, and FIG. 7(B) shows a comparison signal fp. FIG. 7(C) shows an overflow signal Sov output from the accumulator 6, and FIG. 7(D) shows the output current Icp of the charge pump circuit 4. In addition, FIG. 7(E) shows the output current Isc of the spurious signal cancel circuit 7A, and FIG. 7(F) shows the output current Do supplied to the loop filter 5.

Figure 3:
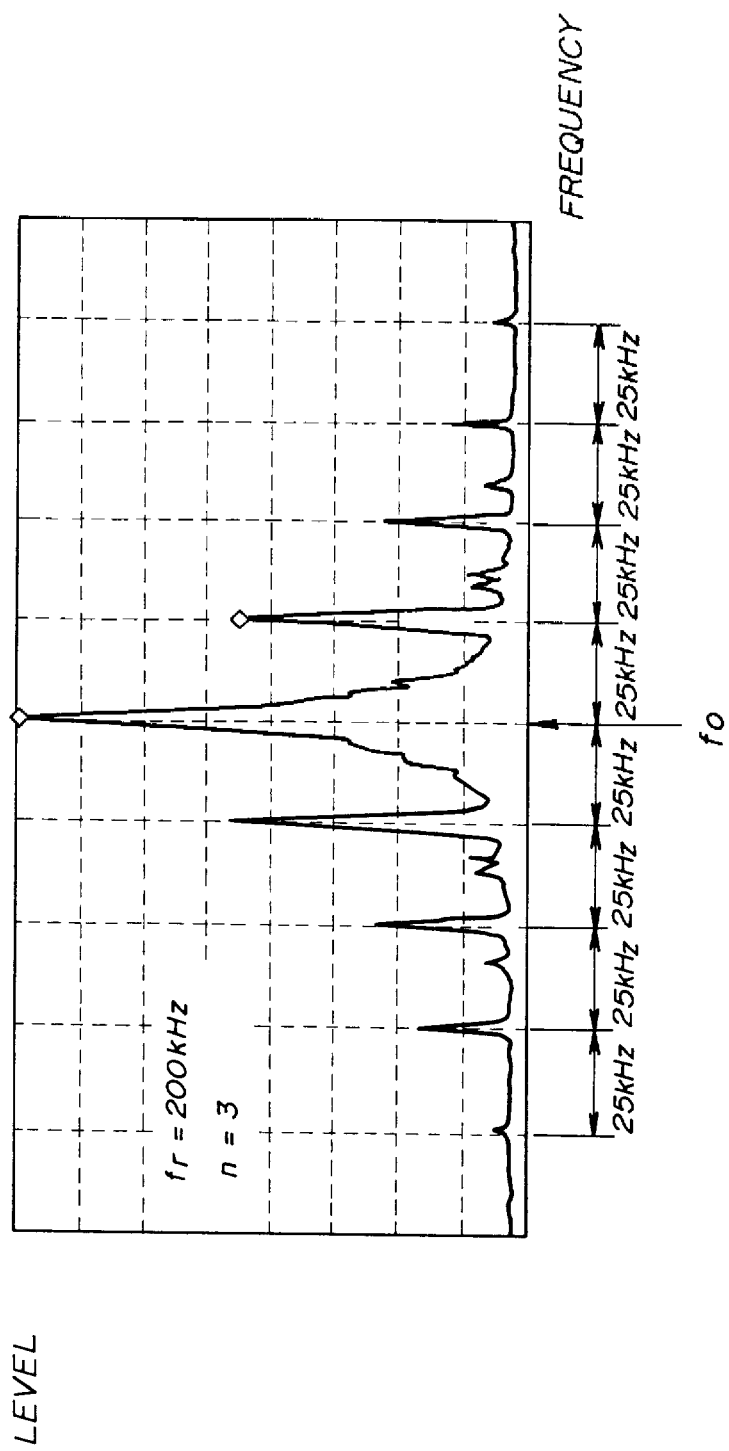
FIG. 3 is a diagram showing a frequency spectrum of an output signal of a VCO.
Figure 4:
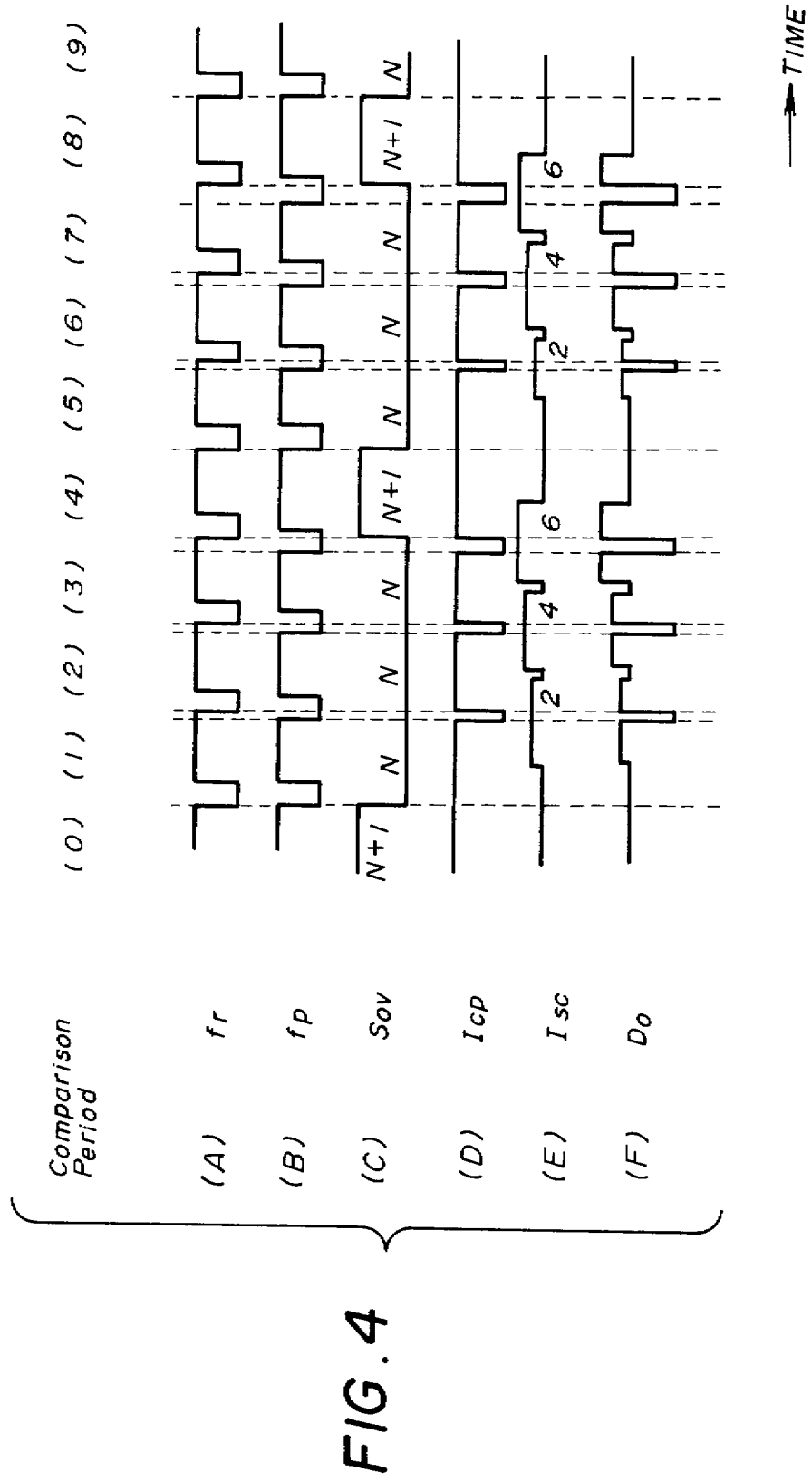
FIG. 4 shows timing charts for explaining the operating principle of a spurious signal cancel circuit.
Figure 5:
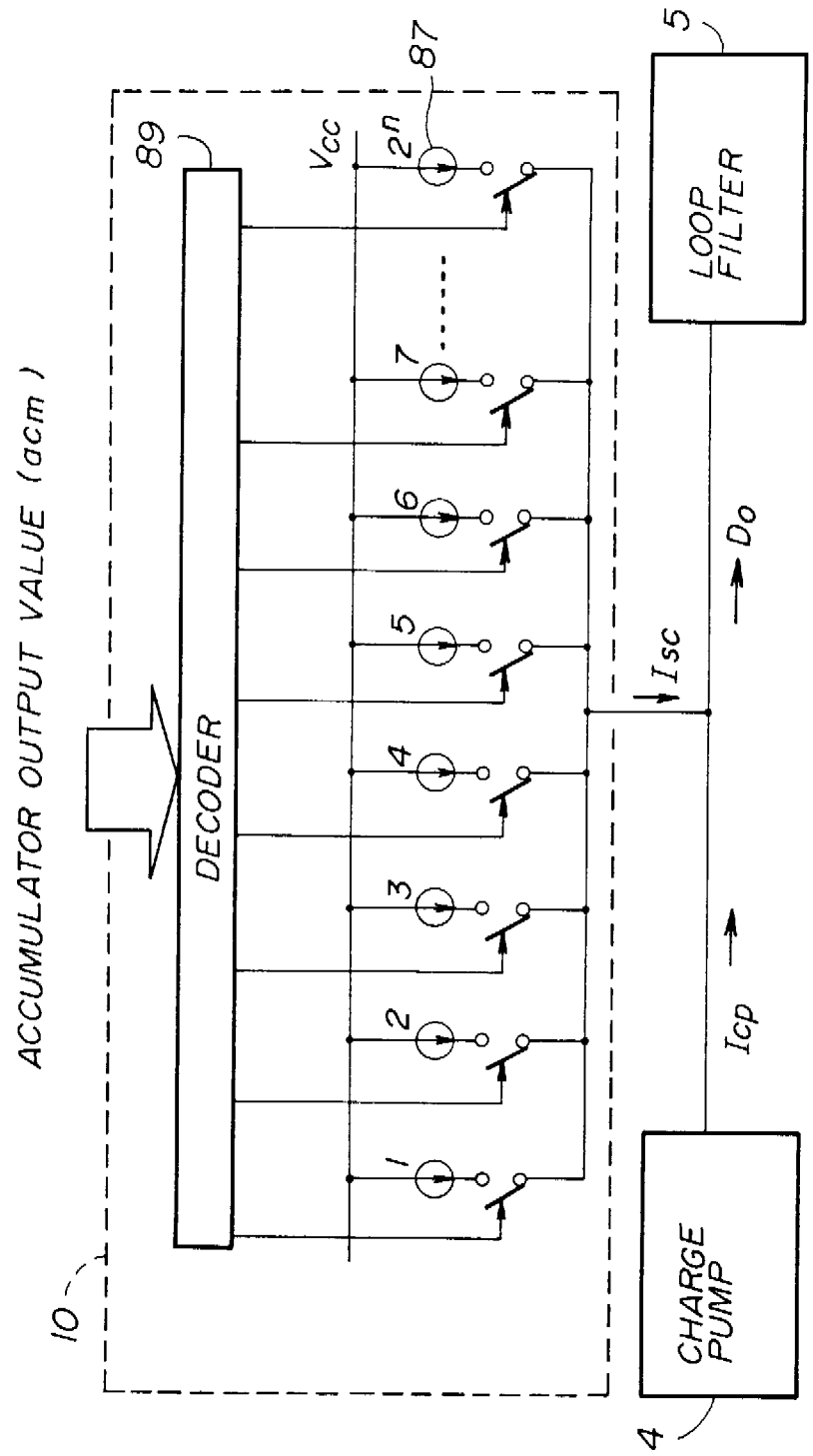
FIG. 5 is a circuit diagram showing the construction of a conceivable spurious signal cancel circuit.

In this case, the held value acm of the accumulator 6 is incremented by F=2 for every comparison period, and accordingly changes as 0, 2, 4, 6, 0, 2, ... for each of the comparison periods (0), (1), (2), (3), (4), (5), ... As a result, an overflow of the accumulator 6 occurs once for every 4 comparison periods, that is, at the comparison periods (0), (4), (8), ..., and the overflow signal Sov shown in FIG. 7(C) is output from the accumulator 6 when the overflow occurs. The frequency dividing factor of the frequency divider 2-2 is set to N, but changes to N+1 at the comparison periods (0), (4), (8), ... when the overflow signal Sov is detected. Hence, if the spurious signal cancel circuit 7A were not provided, the output signal frequency fo of a VCO 1 would fluctuate between the frequency fo1=(N+1)×fr and the frequency fo2=N×fr and the spurious signals shown in FIG. 3 would be generated.

However, according to the present invention, the fractional N-frequency synthesizer shown in FIG. 6A is provided with the spurious signal cancel circuit 7A which includes the pulse forming circuit 8 and the single constant current circuit 9 which is driven and controlled by the pulse forming circuit 8. As shown in FIG. 7(E), the spurious signal cancel circuit 7A generates the output current Isc of the constant current circuit 9 which has a magnitude proportional to the output value (held value) acm of the accumulator 6, and superimposes this output current Isc on the output current Icp of the charge pump circuit 4. A superimposed output current Do has a waveform shown in FIG. 7(F). This output current Do is smoothened and converted into a voltage by a loop filter 5, and the output voltage of the loop filter 5 is supplied to the VCO 1 as the control voltage.

As shown in FIG. 7(D), the output current Icp of the charge pump circuit 4 shows a periodic change, thereby causing the spurious signals. As shown in FIG. 7(E), the output current Isc of the spurious signal cancel circuit 7A is output in a direction opposite to the output current Icp of the charge pump circuit 4. If the area of the waveform of the output current Icp of the charge pump circuit 4 shown in FIG. 7(D) and the area of the waveform of the output current Isc of the spurious signal cancel circuit 7A shown in FIG. 7(E) are the same, it is possible to cancel the periodic change of the output current Icp of the charge pump circuit 4 and to reduce the spurious signals as shown in FIG. 7(F) by adding the output current Isc of the spurious signal cancel circuit 7A to the output current Icp of the charge pump circuit 4.

Next, a description will be given of embodiments of the spurious signal cancel circuit 7A and the pulse forming circuit 8 of the present invention.

Figure 9:
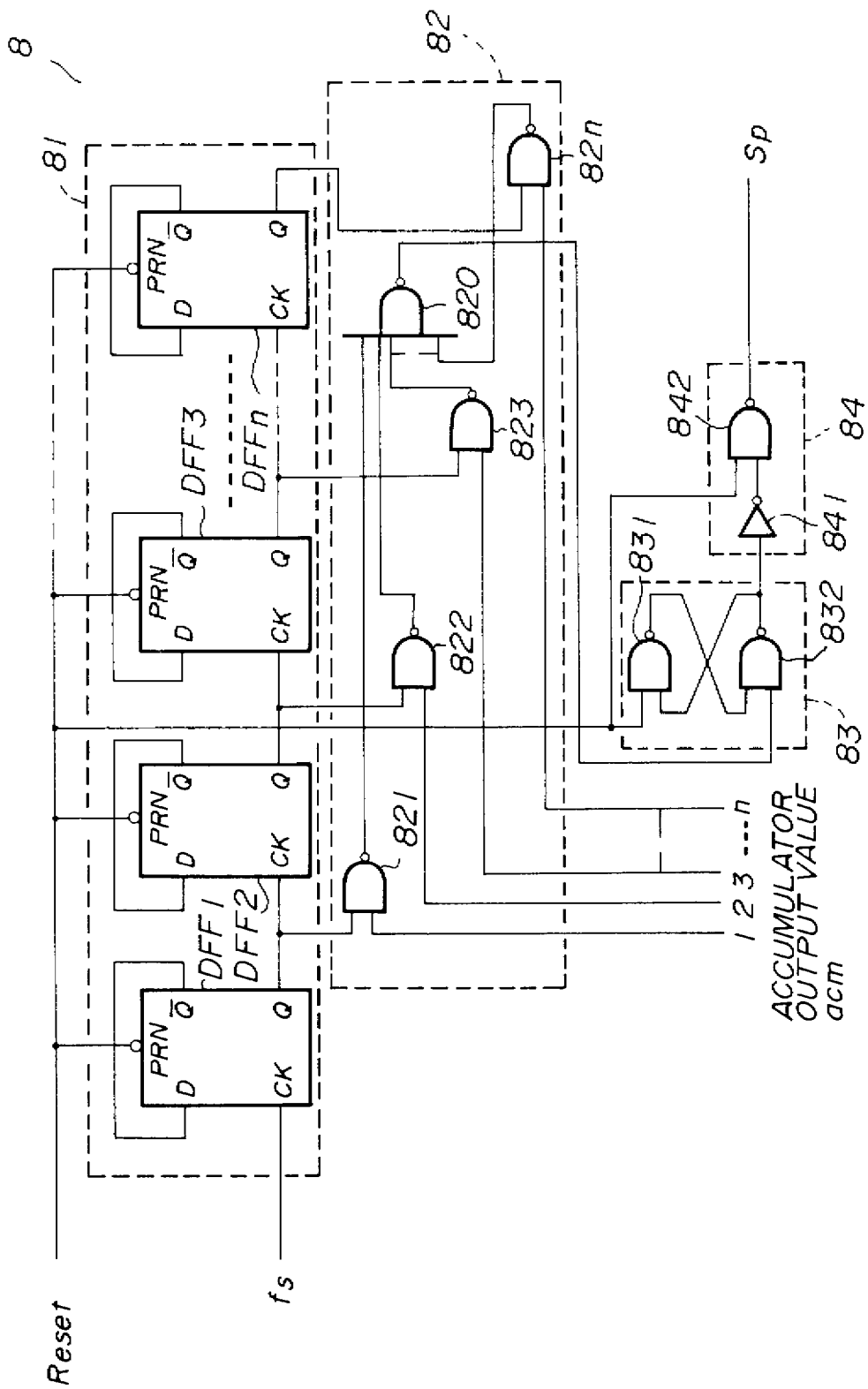
FIG. 9 is a circuit diagram showing a first embodiment of the pulse forming circuit.

FIG. 9 is a circuit diagram showing a first embodiment of the pulse forming circuit 8. The pulse forming circuit 8 shown in FIG. 9 includes a counter part 81 which includes an asynchronous counter which is formed by n delay (D) flip-flops $DFF_1$ through $DFF_n$, a logic circuit part 82 which detects a match between a counted value of the counter part 81 and the output value acm of the accumulator 6, a set-reset (SR) latch circuit part 83 which inputs the reset signal Reset and an output signal of the logic circuit part 82, and an output part 84 which inputs the reset signal Reset and an output signal of the SR latch circuit part 83 and outputs the pulse voltage signal Sp.

The pulse forming circuit 8 shown in FIG. 9 generates the pulse voltage signal Sp shown in FIG. 8. The spurious signal cancelling reference signal fs which is input to the pulse forming circuit 8 is input to a clock input terminal CK of the flip-flop $DFF_1$ which is provided at a first stage of the n flip-flops $DFF_1$ through $DFF_n$, and stipulates a counting period of the counter part 81. When the reset signal Reset is input to the pulse forming circuit 8, this reset signal Reset is input to a reset terminal PRN of each of the flip-flops $DFF_1$ through $DFF_n$ to reset the flip-flops $DFF_1$ through $DFF_n$ and to initialize the counted value of the counter part 81. At the same time, the reset signal Reset is also input to the output part 84, and puts the pulse voltage signal Sp which is output from the output part 84 into a high-level state. on the other hand, the counter part 81 counts up and increments the counted value by one for every period of the spurious signal cancelling reference signal fs.

The logic circuit part 82 includes NAND circuits 820, and 821 through 82n which are connected as shown in FIG. 9. The logic circuit part 82 monitors the output values of each of the flip-flops $DFF_1$ through $DFF_n$ of the counter part 81, and outputs a match detection signal to the SR latch circuit part 83 when the counted value from the counter part 81 matches the output value acm of the accumulator 6. As a result, the held data in the SR latch circuit part 83 is inverted in response to the match detection signal, thereby putting the pulse voltage signal Sp output from the output part 84 into a low-level state. Hence, the output part 84 outputs the pulse voltage signal Sp which maintains the high-level state for a time proportional to the output value acm of the accumulator 6 from the time when the reset signal Reset is input.

The SR latch circuit part 83 includes NAND circuits 831 and 832 which are connected as shown in FIG. 9. In addition, the output part 84 includes an inverter 841 and a NAND circuit 842 which are connected as shown in FIG. 9.

Figure 10:
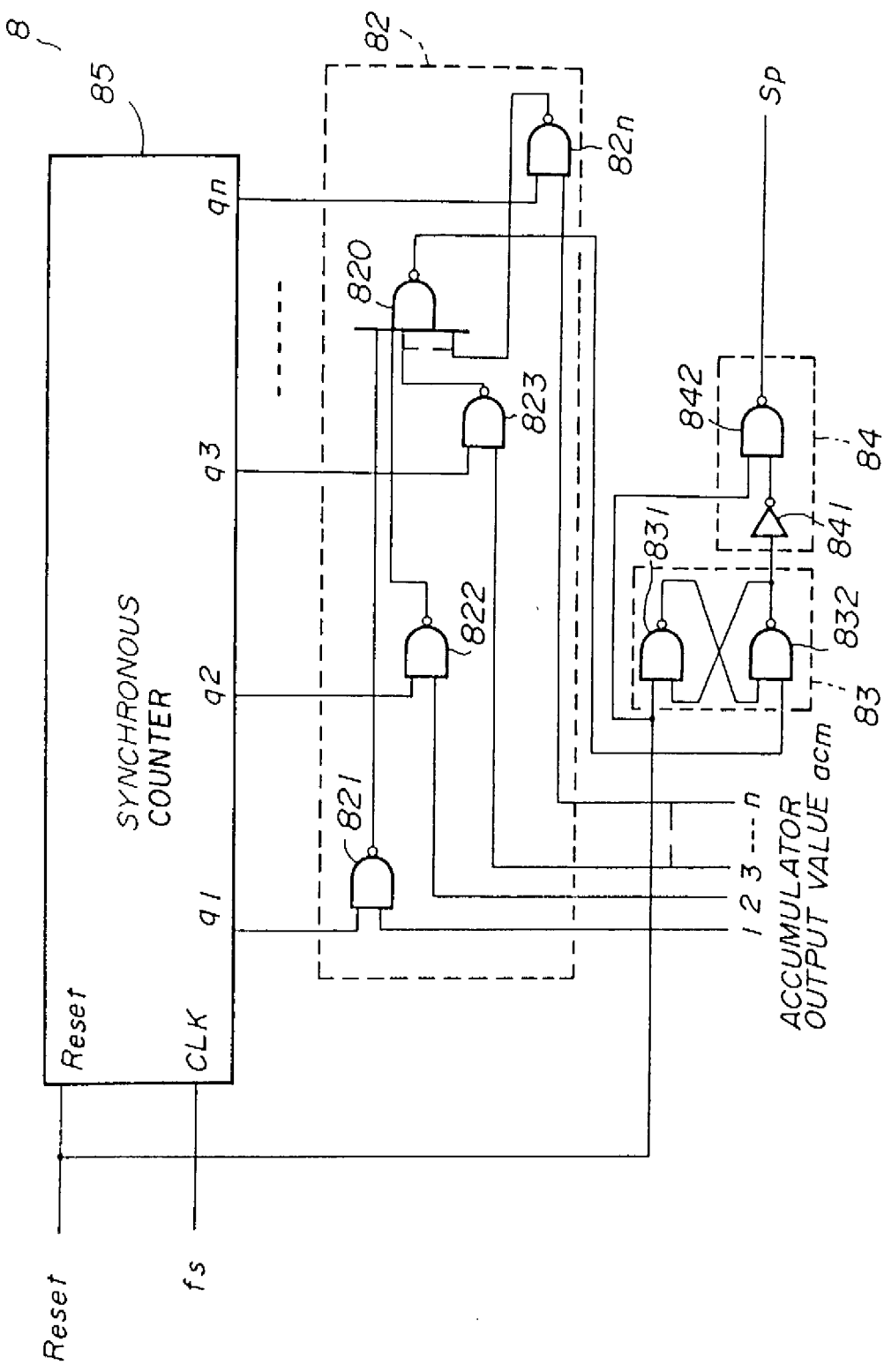
FIG. 10 is a circuit diagram showing a second embodiment of the pulse forming circuit.

FIG. 10 shows a second embodiment of the pulse forming circuit 8. In FIG. 10, those parts which are the same as those corresponding parts in FIG. 9 are designated by the same reference numerals, and a description thereof will be omitted.

In the first embodiment of the pulse forming circuit 8 shown in FIG. 9, the counter part 81 includes the asynchronous counter which is formed by the n flip-flops $DFF_1$ through $DFF_n$. But in this second embodiment of the pulse forming circuit 8 shown in FIG. 10, the asynchronous counter is replaced by a synchronous counter 85.

In the counter part 81 shown in FIG. 9, a Q-output of a flip-flop is input to a clock input terminal CK of a flip-flop provided in the next stage. Hence, the further away the flip-flop is from the flip-flop $DFF_1$ which is provided at the first stage, the more the timing of the Q-output is delayed from the spurious signal cancelling reference signal fs. For this reason, the operation of the logic circuit part 82 which monitors the Q-outputs of each of the flip-flops $DFF_1$ through $DFF_n$ within the counter part 81 to detect the match between the counted value of the counter part 81 and the output value acm of the accumulator 6 is delayed. In other words, the timing with which the logic circuit part 82 inverts the held data of the SR latch circuit part 83 and puts the output pulse voltage signal Sp of the output part 82 to the low-level state is delayed. This timing delay extends the time for which the constant current circuit 9 shown in FIG. 6A is turned ON, thereby generating a surplus output current Isc of the spurious signal cancel circuit 7A, and the accuracy of the spurious signal cancel process may deteriorate.

On the other hand, when the synchronous counter 85 shown in FIG. 10 is used, all outputs q1 through qn of the synchronous counter 85 are output in synchronism with the spurious signal cancelling signal fs. Therefore, the output timing will not change depending on the counter value of the synchronous counter 85, and it is possible to further improve the accuracy of the spurious signal cancel process compared to the pulse forming circuit 8 shown in FIG. 9.

Figure 11:
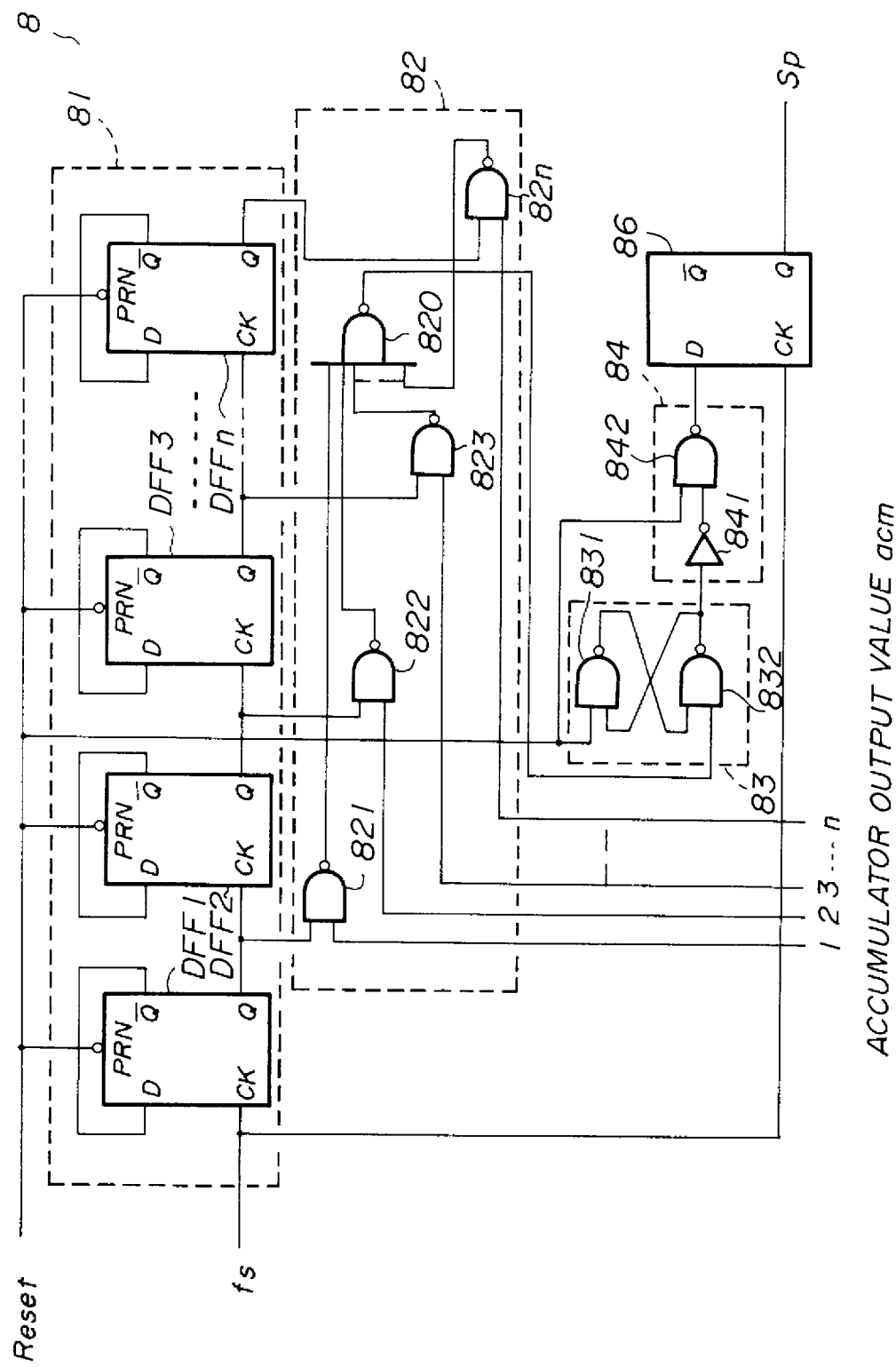
FIG. 11 is a circuit diagram showing a third embodiment of the pulse forming circuit.

FIG. 11 is a circuit diagram showing a third embodiment of the pulse forming circuit 8. In FIG. 11, those parts which are the same as those corresponding parts in FIG. 9 are designated by the same reference numerals, and a description thereof will be omitted.

In the pulse forming circuit 8 shown in FIG. 11, a synchronizing flip-flop 86 which operates in synchronism with the spurious signal cancelling reference signal fs is added to an output stage of the output part 84 shown in FIG. 9.

In the first embodiment of the pulse forming circuit 8 shown in FIG. 9, when the reset signal Reset is input, the pulse voltage signal Sp output from the output part 84 assumes the high level after a delay time that is necessary to invert the logic state of the output part 84. In addition, when the counted value of the counter part 81 and the output value acm of the accumulator 6 matches in the pulse forming circuit 8 shown in FIG. 9, a predetermined delay occurs before the logic circuit part 82 detects the match and outputs the match detection signal. Furthermore, a predetermined delay occurs before the match detection signal inverts the held data of the SR latch circuit part 83 and puts the output pulse voltage signal Sp of the output part 84 into the low-level state. These delays extend the time for which the constant current circuit 9 shown in FIG. 6A is turned ON, thereby generating a surplus output current Isc of the spurious signal cancel circuit 7A, and the accuracy of the spurious signal cancel process may deteriorate.

On the other hand, by providing the synchronizing flip-flop 86 which operates in synchronism with the spurious signal cancelling reference signal fs on the output side of the output part 84 as shown in FIG. 11, the output pulse voltage signal Sp of the output part 84 is once held in the synchronizing flip-flop 86 so that the pulse voltage signal Sp can be output in synchronism with the spurious signal cancelling reference signal fs. As a result, the delays generated in the counter part 81, the logic circuit part 82, the SR latch circuit part 83 and the output part 84 are all adjusted and settled with respect to the spurious signal cancelling reference signal fs. Therefore, the pulse voltage signal Sp which is output from the synchronizing flip-flop 86 has a pulse width accurately proportional to the output value acm of the accumulator 6, and it is possible to carry out a highly accurate spurious signal cancel process.

Next, a description will be given of the circuit which inputs the spurious signal cancelling reference signal fs to the pulse forming circuit 8 of the spurious signal cancel circuit 7A, by referring back to FIG. 6A.

As shown in FIG. 8, the spurious signal cancelling reference signal fs becomes a reference for stipulating the pulse width of the pulse voltage signal Sp which is output from the pulse forming circuit 8. The pulse width of this pulse voltage signal Sp becomes the pulse width of the output current Isc of the spurious signal cancel circuit 7A shown in FIG. 7(E). Accordingly, as may be seen from FIGS. 7(A) through 7(F) and 8, the pulse width of the pulse voltage signal Sp must be accurately controlled within one comparison period. Thus, the spurious signal cancelling reference signal fs must have a frequency greater than or equal to at least $2^n$ times the frequency of the reference signal fr or the comparison signal fp, where n denotes the number of bits of the accumulator 6. The higher the frequency of the spurious signal cancelling reference signal fs, the faster the operation speed of the pulse forming circuit 8, and inconveniences such as a large power consumption are introduced.

For this reason, the frequency of the spurious signal cancelling reference signal fs cannot increased blindly to a high frequency. In view of the above, it is appropriate to input the spurious signal cancelling reference signal fs to the pulse forming circuit 8 according to one of the following six embodiments of the present invention.

Figure 12:
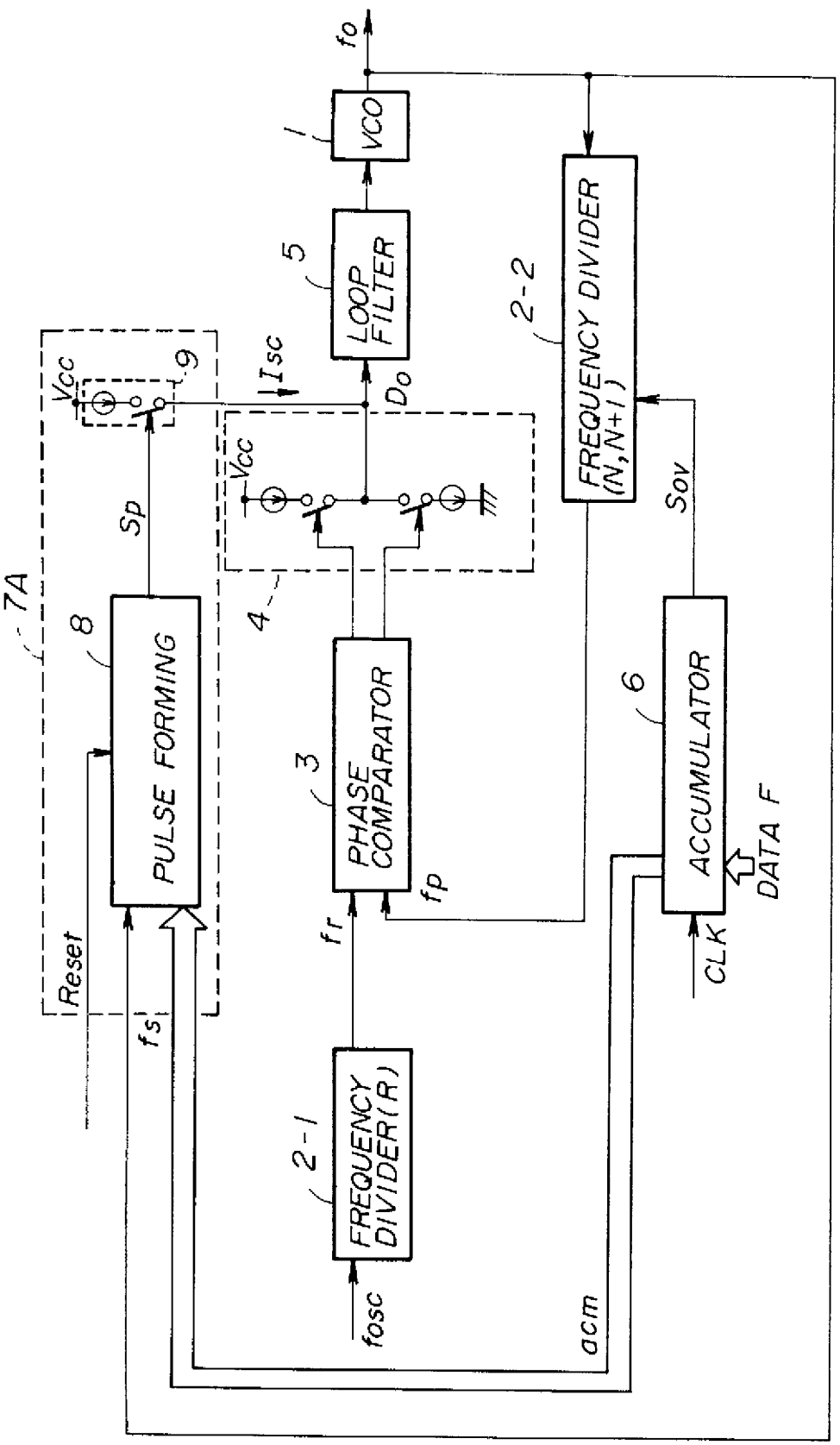
FIG. 12 is a system block diagram showing a first embodiment of a fractional N-frequency synthesizer according to the present invention.

FIG. 12 is a system block diagram showing a first embodiment of the fractional N-frequency synthesizer according to the present invention. In FIG. 12, those parts which are the same as those corresponding parts in FIG. 6A are designated by the same reference numerals, and a description thereof will be omitted.

In this embodiment, the output signal fo of the VCO 1 is used as the spurious signal cancelling reference signal fs. Hence, if the frequency dividing factor N of the frequency divider 2-2 is $2^n$ or greater, for example, where n indicates the number of bits of the accumulator 6, the construction of this embodiment is suited in such a case because the output signal frequency fo of the VCO 1 is N times the frequency of the comparison signal fp which is input to the phase comparator 3 from the accumulator 6, where N indicates the frequency dividing factor of the frequency divider 2-2. According to the construction of this embodiment, the output signal fo of the VCO 1 is used as it is as the spurious signal cancelling reference signal fs, and the circuit construction is simple in that it is unnecessary to provide an independent circuit for generating the spurious signal cancelling reference signal fs.

Furthermore, when the channel of the fractional N-frequency synthesizer is switched, that is, when the frequency dividing factor N of the frequency divider 2-2 is switched, the width of the waveform of the output current Icp of the charge pump circuit 4 changes in FIG. 7(D) at the time of the lock-up. In other words, when the output signal frequency fo of the VCO 1 becomes high, the width of the waveform of the output current Icp of the charge pump circuit 4 becomes narrow. According to this embodiment shown in FIG. 12, the width of the waveform of the output current Isc of the spurious signal cancel circuit 7A and the width of the waveform of the output current Icp of the charge pump circuit 4 change similarly, and the area of the waveform of the output current Isc of the spurious signal cancel circuit 7A and the area of the waveform of the output current Icp of the charge pump circuit 4 constantly match, thereby introducing no channel dependency in the spurious signal characteristic.

Figure 13:
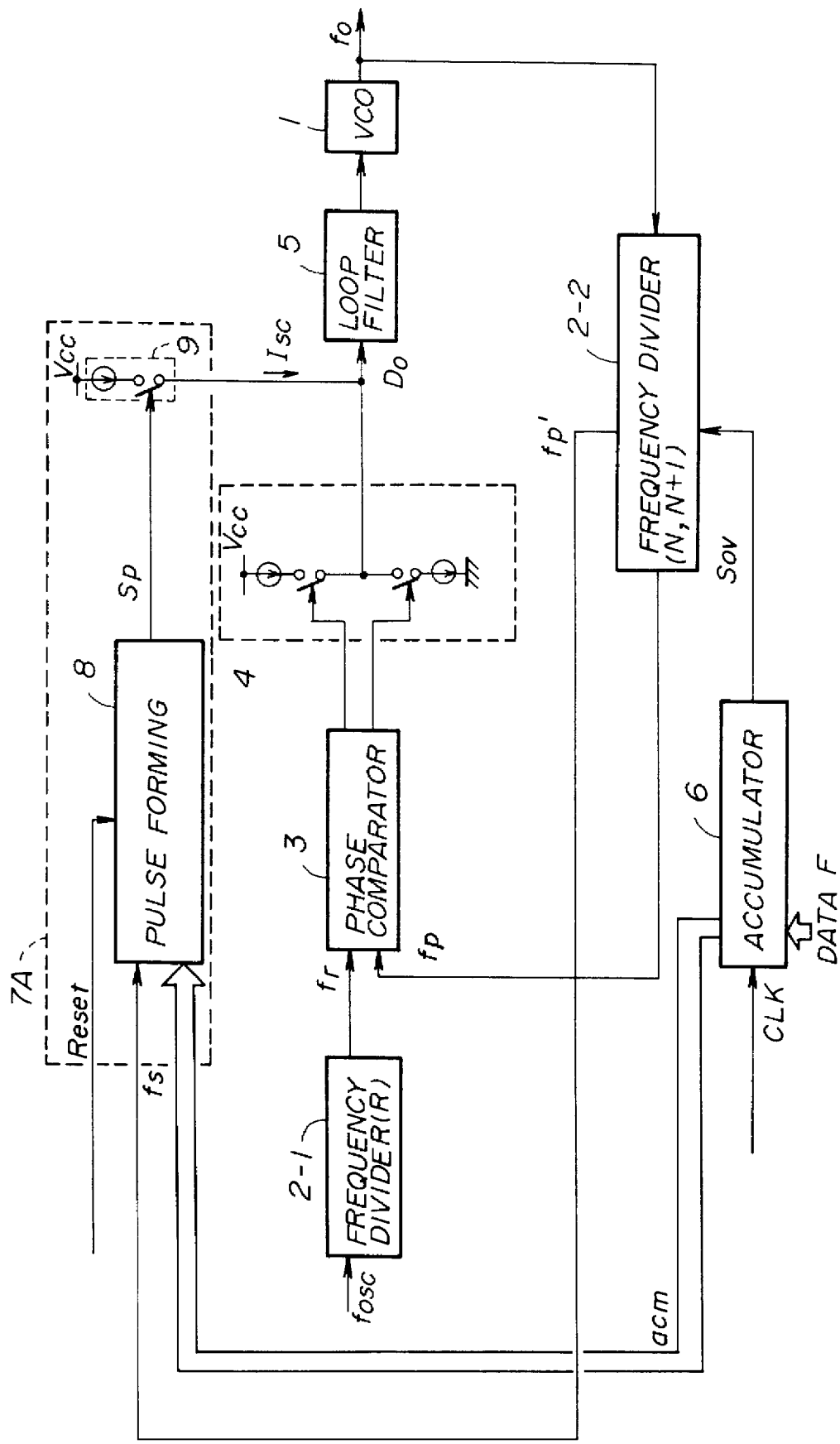
FIG. 13 is a system block diagram showing a second embodiment of the fractional N-frequency synthesizer according to the present invention.

FIG. 13 is a system block diagram showing a second embodiment of the fractional N-frequency synthesizer according to the present invention. In FIG. 13, those parts which are the same as those corresponding parts in FIG. 6A are designated by the same reference numerals, and a description thereof will be omitted.

In this embodiment, a signal fp' which is obtained from an intermediate terminal of the frequency divider 2-2 which generates the comparison signal fp is used as the spurious signal cancelling reference signal fs. Because the signal fp' is obtained from the intermediate terminal of the frequency divider 2-2, a frequency dividing factor n at this intermediate terminal is smaller than the frequency dividing factor N which is used to generate the comparison signal fp. Hence, a relationship fp<fp'<fo stands among the comparison signal frequency fp, the signal frequency fp' and the output signal frequency fo of the VCO 1.

The construction of this embodiment is effective when applied to a case where the frequency dividing factor N of the frequency divider 2-2 which is used to generate the comparison signal fp is greater than $2^n$, where n indicates the number of bits of the accumulator 6, and the output signal frequency fo of the VCO 1 is considerably higher than the comparison signal frequency fp. If the output signal fo of the VCO 1 is used as it is as the spurious signal cancelling reference signal fs in such a case, the operation speed of the counter part 81 which counts the spurious signal cancelling reference signal fs within the pulse forming circuit 8 becomes too fast, thereby increasing the power consumption. But in this embodiment, the spurious signal cancelling reference signal fs is obtained from the intermediate terminal fo the frequency divider 2-2 which generates the comparison signal fp, so that there is no need to provide an independent circuit for generating the spurious signal cancelling reference signal fs and the circuit construction becomes simple. Furthermore, no channel dependency is introduced in the spurious signal characteristic, similarly to the first embodiment shown in FIG. 12.

Figure 14:
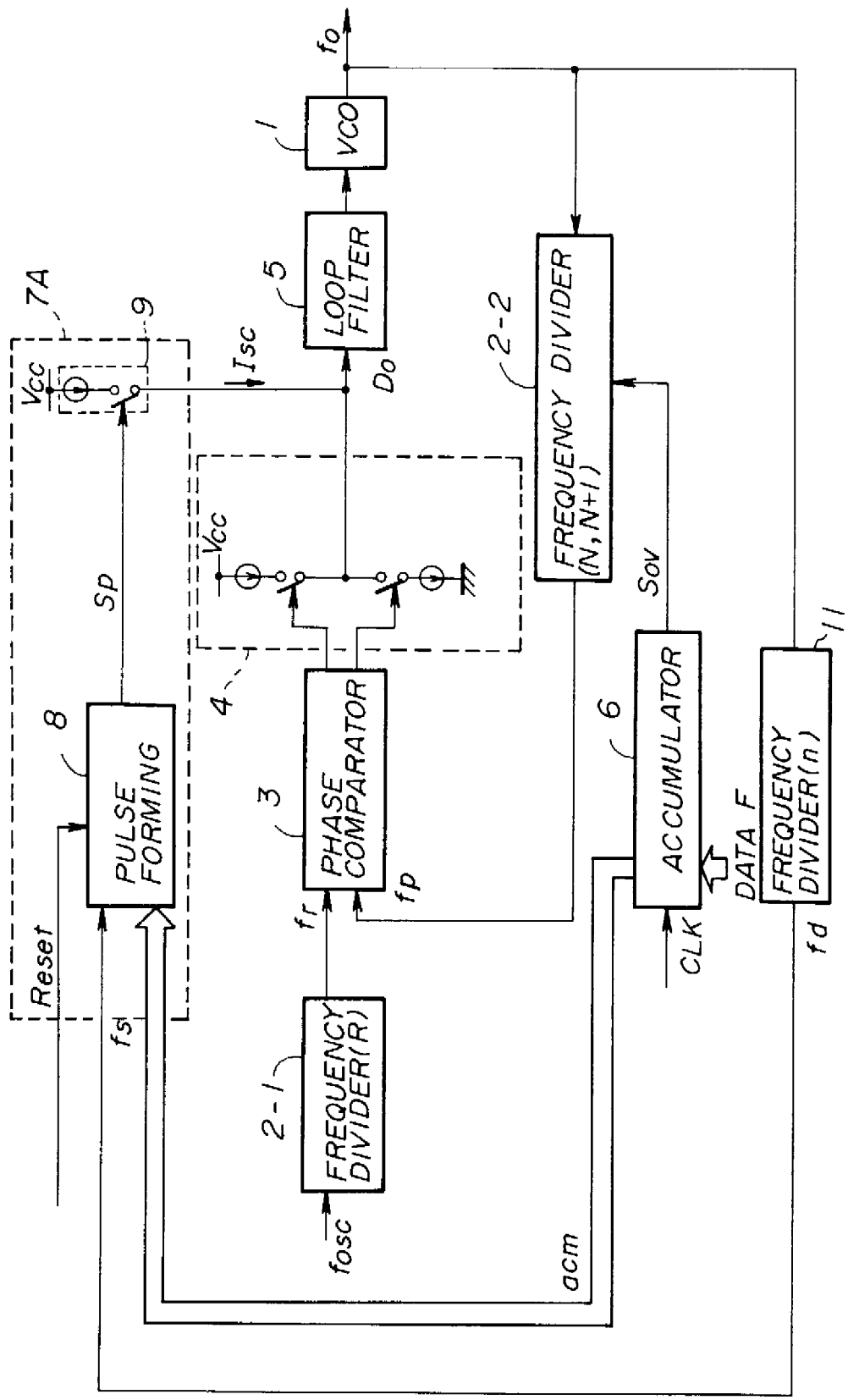
FIG. 14 is a system block diagram showing a third embodiment of the fractional N-frequency synthesizer according to the present invention.

FIG. 14 is a system block diagram showing a third embodiment of the fractional N-frequency synthesizer according to the present invention. In FIG. 14, those parts which are the same as those corresponding parts in FIG. 6A are designated by the same reference numerals, and a description thereof will be omitted.

In this embodiment, a signal fd which is obtained by frequency-dividing the output signal fo of the VCO 1 by a frequency divider 11 which is provided independently of the frequency divider 2-2 which outputs the comparison signal fp, is used as the spurious signal cancelling reference signal fs. A frequency dividing factor n of the frequency divider 11 is set smaller than the frequency dividing factor N of the frequency divider 2-2, and a relationship fp<fd<fo stands among the comparison signal frequency fp, the output signal frequency fd of the frequency divider 11 and the output signal frequency fo of the VCO 1.

As in the case of the embodiment shown in FIG. 13, the construction of this embodiment is effective when applied to a case where the frequency dividing factor N of the frequency divider 2-2 which is used to generate the comparison signal fp is greater than $2^n$, where n indicates the number of bits of the accumulator 6, and the output signal frequency fo of the VCO 1 is considerably higher than the comparison signal frequency fp. Particularly because the frequency divider 2-2 which generates the comparison signal fp has a complicated structure such that the frequency dividing factor thereof varies between N and N+1, in some cases it is difficult to obtain from an intermediate terminal a signal which has a frequency appropriate for the spurious signal cancelling reference signal fs. In such cases, it is effective to use the construction of this embodiment shown in FIG. 14 in place of the construction of the embodiment shown in FIG. 13. According to this embodiment, no channel dependency is introduced in the spurious signal characteristic, similarly as in the case of the embodiments shown in FIGS. 12 and 13.

Figure 15:
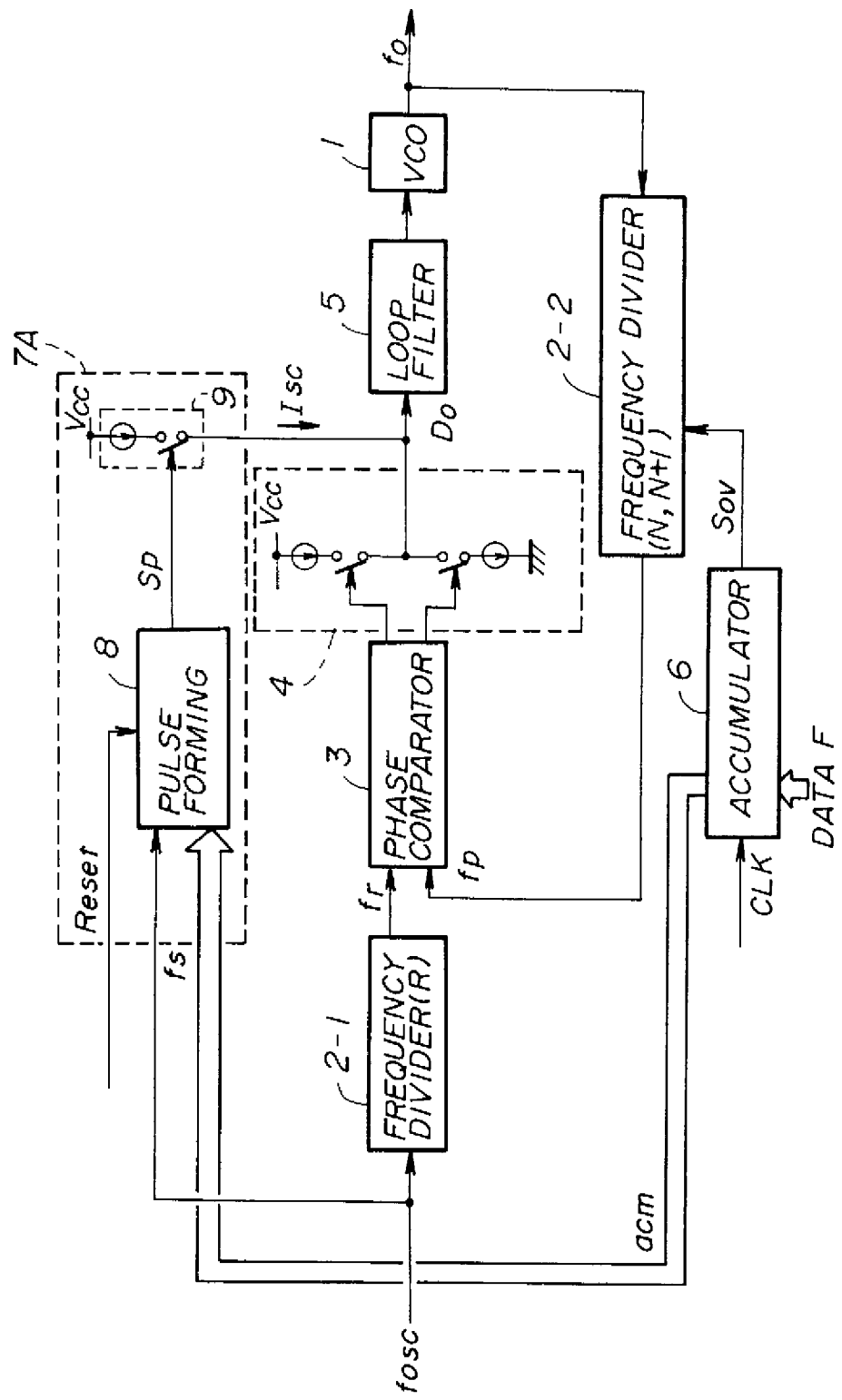
FIG. 15 is a system block diagram showing a fourth embodiment of the fractional N-frequency synthesizer according to the present invention.

FIG. 15 is a system block diagram showing a fourth embodiment of the fractional N-frequency synthesizer according to the present invention. In FIG. 15, those parts which are the same as those corresponding parts in FIG. 6A are designated by the same reference numerals, and a description thereof will be omitted.

In this embodiment, the source reference signal fosc which is input to the frequency divider 2-1 which generates the reference signal fr, is used as the spurious signal cancelling reference signal fs. The construction shown in FIG. 15 is suited for a case where a frequency dividing factor R of the frequency divider 2-1 is greater than or equal to $2^n$, where n indicates the number of bits of the accumulator 6, because the source reference signal frequency fosc is greater than or equal to $2^n$ times the reference signal frequency fr in such a case. According to the construction shown in FIG. 15, the source reference signal fosc is used as it is as the spurious signal cancelling reference signal fs. For this reason, there is no need to provide an independent circuit for generating the spurious signal cancelling reference signal fs, and the circuit construction becomes simple.

Figure 16:
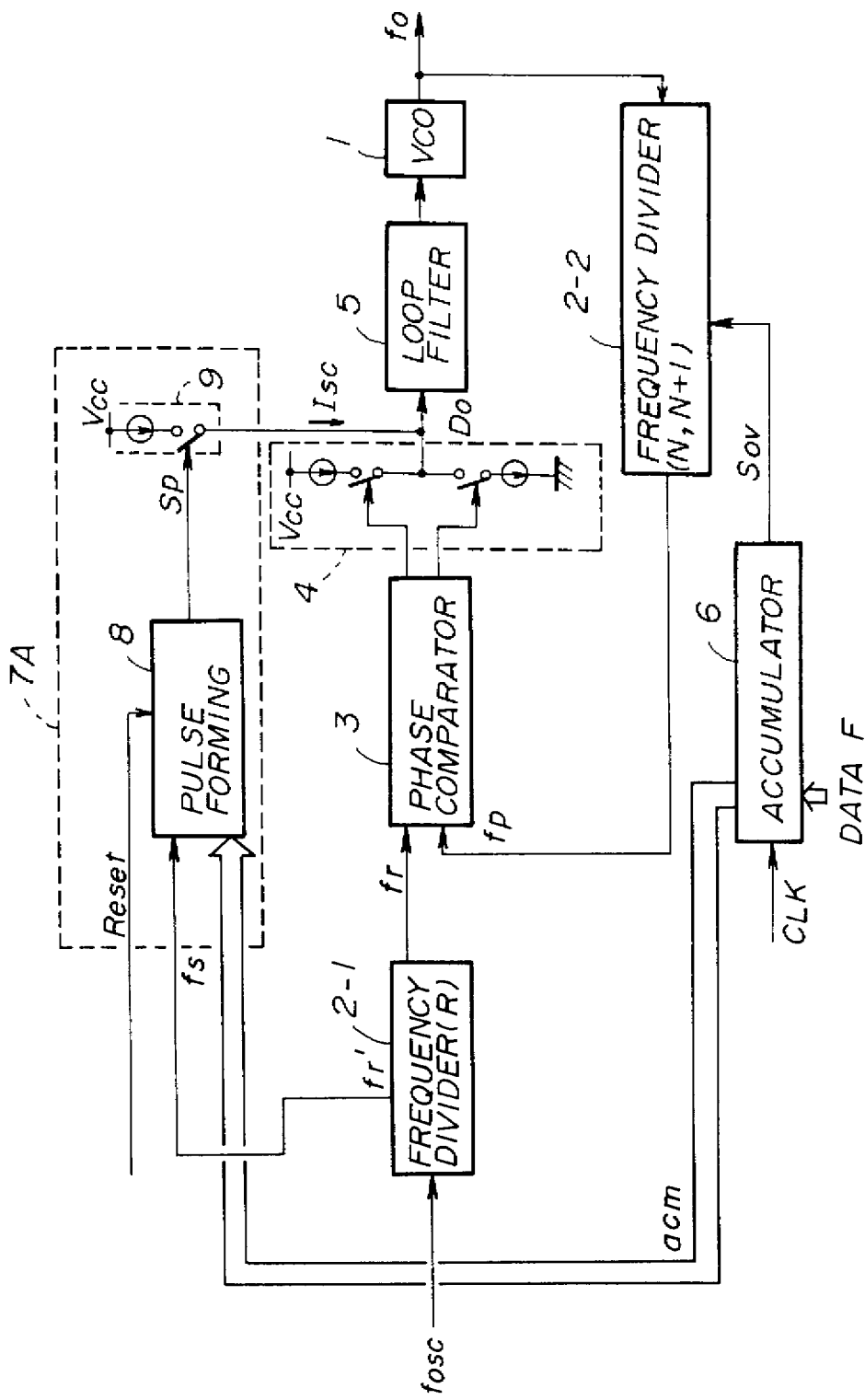
FIG. 16 is a system block diagram showing a fifth embodiment of the fractional N-frequency synthesizer according to the present invention.

FIG. 16 is a system block diagram showing a fifth embodiment of the fractional N-frequency synthesizer according to the present invention. In FIG. 16, those parts which are the same as those corresponding parts in FIG. 6A are designated by the same reference numerals, and a description thereof will be omitted.

In this embodiment, a signal fr' which is obtained from an intermediate terminal of the frequency divider 2-1 which generates the reference signal fr, is used as the spurious signal cancelling reference signal fs. Because the signal fr' is obtained from the intermediate terminal of the frequency divider 2-1, the frequency dividing factor n at this intermediate terminal is smaller than the frequency dividing factor R which is used to generate the reference signal fr. Hence, a relationship fr<fr'<fosc stands among the reference signal frequency fr, the signal frequency fr' and the source reference signal frequency fosc.

It is effective to use the construction shown in FIG. 16 in a case where the frequency dividing factor R of the frequency divider 2-1 that is used to generate the reference signal fr is greater than $2^n \times$fosc/fr' and the source reference signal frequency fosc is considerably high compared to the reference signal frequency fr. In such a case, if the source reference signal fosc were used as it is as the spurious signal cancelling reference signal fs, the operation speed of the flip-flops $DFF_1$ through $DFF_n$ of the counter part 81 which counts the spurious signal cancelling reference signal fs within the pulse forming circuit 8 would become high, and the power consumption would increase. However, according to this embodiment, it is unnecessary to provide an independent circuit for generating the spurious signal cancelling reference signal fs and the circuit construction is simple because the spurious signal cancelling reference signal fs is obtained from the intermediate terminal of the frequency divider 2-1 which generates the reference signal fr.

Figure 17:
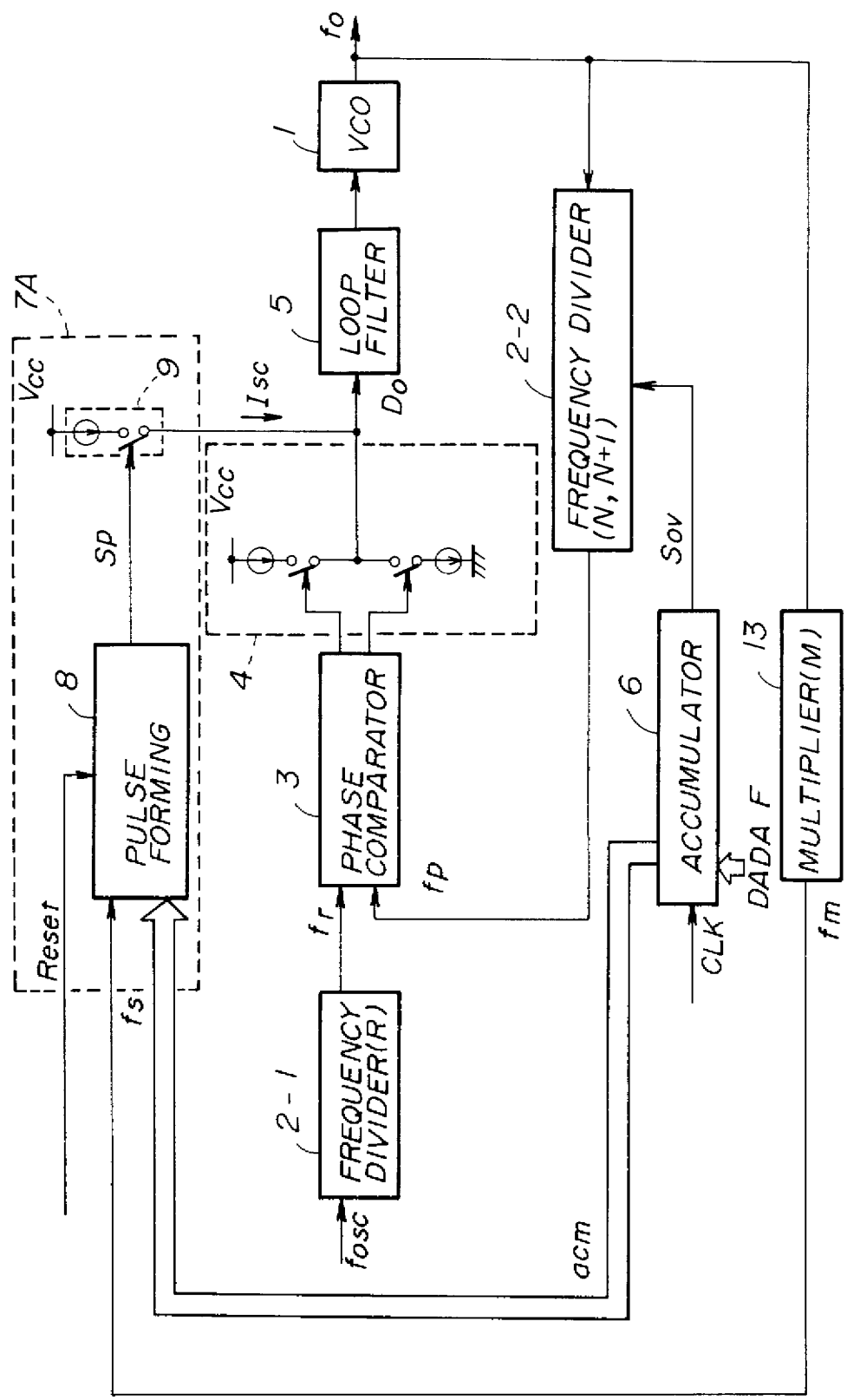
FIG. 17 is a system block diagram showing a sixth embodiment of the fractional N-frequency synthesizer according to the present invention.

FIG. 17 is a system block diagram showing a sixth embodiment of the fractional N-frequency synthesizer according to the present invention. In FIG. 17, those parts which are the same as those corresponding parts in FIG. 6A are designated by the same reference numerals, and a description thereof will be omitted.

In this embodiment, a signal fm which is obtained by multiplying the output signal frequency fo of the VCO 1 by a multiplying factor M, is used as the spurious signal cancelling reference signal fs. This embodiment is effective when applied to a case where the frequency dividing factor N of the frequency divider 2-2 which generates the comparison signal fp is smaller than $2^n$, where n indicates the number of bits of the accumulator 6, and the output signal frequency fo is less than or equal to $2^n$ times the comparison signal frequency fp. If the output signal fo were used as it is as the spurious signal cancelling reference signal fs in such a case, it would be difficult to generate the pulse voltage signal Sp in which one comparison period, that is, the period of the comparison signal fp, is finely divided. The multiplying factor M of a frequency multiplier 13 is set so that the output signal frequency fm of the frequency multiplier 13 is greater than or equal to $2^n$ times the comparison signal frequency fp, where n indicates the number of bits of the accumulator 6. According to this embodiment, it is possible to carry out an accurate spurious signal cancel process even in a case where the frequency dividing factor N of the frequency divider 2-2 which generates the comparison signal fp is close to 1.

In addition, as described above, by setting the multiplying factor M equal to $2^n$, where n indicates the number of bits of the accumulator 6, and outputting the output current Isc of the spurious signal cancel circuit 7A at the same timing as the output current Icp of the charge pump circuit 4, the shape of the waveform of the output current Icp of the charge pump circuit 4 becomes the same as the shape of the waveform of the output current Isc of the spurious signal cancel circuit 7A. As a result, it is possible to completely cancel the waveform of the output current Icp of the charge pump circuit 4.

Next, a description will be given of a circuit which inputs the reset signal Reset to the pulse forming circuit 8 of the spurious signal cancel circuit 7A.

As described above in conjunction with FIG. 9, the reset signal Reset is input to the reset terminal PRN of each of the flip-flops $DFF_1$ through $DFF_n$ within the pulse forming circuit 8 and initializes the counted value of the counter part 81. At the same time, the reset signal Reset is input to the output part 84 so that the pulse voltage signal Sp output from the output part 84 assumes a high-level state. Therefore, the reset signal Reset controls the generation timing of the output current Isc of the spurious signal cancel circuit 7A as shown in FIG. 7(E). As may be seen from FIG. 7(E), the output current Isc of the spurious signal cancel circuit 7A must be controlled so as to assumes a high-level state once in each of the comparison periods (1), (2), (3), . . . Furthermore, the counted value of the counter part 81 must be reset once in each of the comparison periods (1), (2), (3), . . . Accordingly, the period of the reset signal Reset must be the same period as the comparison period.

As may be seen from FIG. 7(A) or FIG. 7(B), the reference signal fr or the comparison signal fp most simply satisfy the above described conditions. Hence, it is possible to input either the reference signal fr or the comparison signal fp to the pulse forming circuit 8 as the reset signal Reset. A description will hereinafter be made with respect to two embodiments of the circuit for inputting the reset signal Reset to the pulse forming circuit 8.

Figure 18:
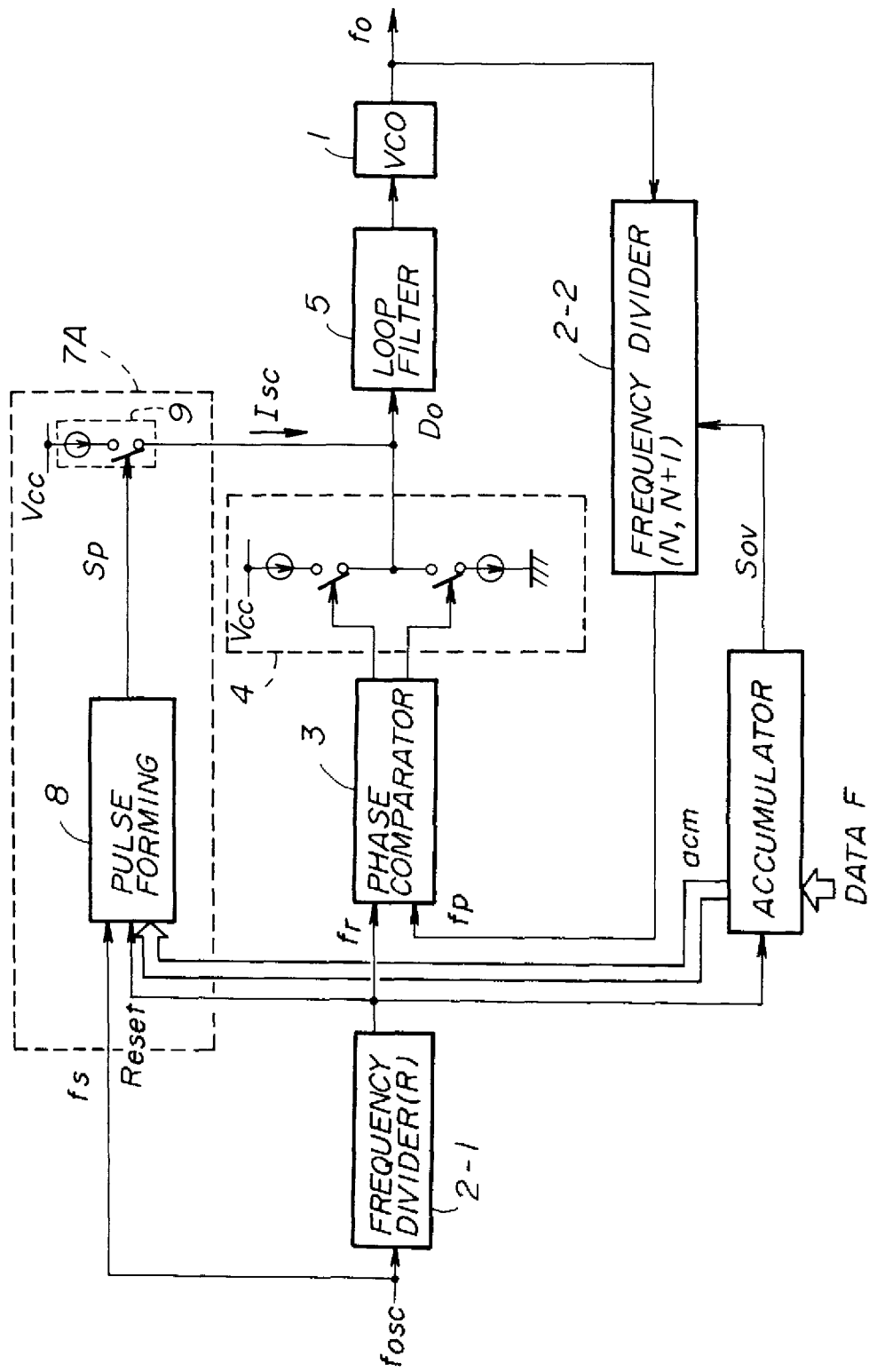
FIG. 18 is a system block diagram showing a seventh embodiment of the fractional N-frequency synthesizer according to the present invention.

FIG. 18 is a system block diagram showing a seventh embodiment of the fractional N-frequency synthesizer according to the present invention. In FIG. 18, those parts which are the same as those corresponding parts in FIG. 6A are designated by the same reference numerals, and a description thereof will be omitted.

In this embodiment, the reference signal fr is used as the reset signal Reset which is input to the pulse forming circuit 8. As shown in FIG. 7(A), the reference signal fr has the same period as the comparison periods (1), (2), (3), . . . As may be seen from the embodiment of the pulse forming circuit shown in FIG. 9, the reset signal Reset is input to the output part 84 of the pulse forming circuit 8 and puts the output pulse voltage signal Sp of the output part 84 into a high-level state.

The pulse voltage signal Sp drives the constant current circuit 9 shown in FIG. 18, so as to generate the output current Isc of the spurious signal cancel circuit 7A shown in FIG. 7(E). On the other hand, as may be seen from the embodiment of the pulse forming circuit 8 shown in FIG. 9, the reset signal Reset is input to the reset terminal PRN of each of the flip-flops $DFF_1$ through $DFF_n$ of the counter part 81 to reset the flip-flops $DFF_1$ through $DFF_n$. As described above in conjunction with FIG. 9, the pulse forming circuit 8 outputs the pulse voltage signal Sp which maintains the high-level state during a time proportional to the output value acm of the accumulator 6 from a time when the flip-flops $DFF_1$ through $DFF_n$ are reset, and thus, the output current Isc is output from the constant current circuit 9 during this time as shown in FIG. 7(E). According to this embodiment, it is unnecessary to provide an independent circuit for generating the reset signal Reset because the reference signal fr is used as it is as the reset signal Reset, and the circuit construction is simple.

Figure 19:
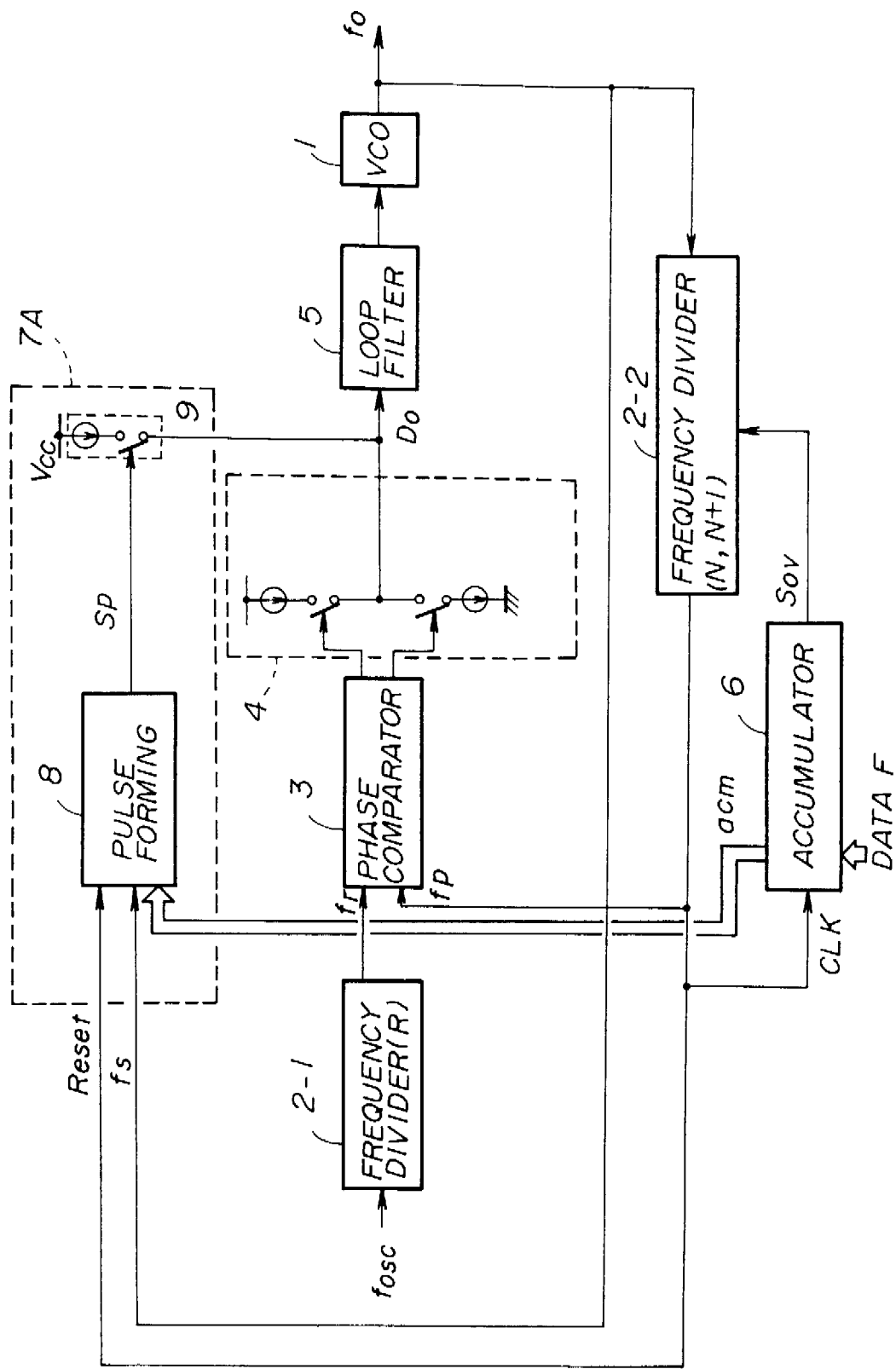
FIG. 19 is a system block diagram showing an eighth embodiment of the fractional N-frequency synthesizer according to the present invention.

FIG. 19 is a system block diagram showing an eighth embodiment of the fractional N-frequency synthesizer according to the present invention. In FIG. 19, those parts which are the same as those corresponding parts in FIG. 6A are designated by the same reference numerals, and a description thereof will be omitted.

In this embodiment, the comparison signal fp is used as the reset signal Reset which is input to the pulse forming circuit 8. As shown in FIG. 7(B), the period of the comparison signal fp is extended during the comparison periods (0), (4), (8), . . . in which the accumulator 6 overflows, but on the average, the period of the comparison signal fp is the same as the comparison periods (1), (2), . . . When this comparison signal fp is input to the pulse forming circuit 8 as the reset signal Reset, the pulse forming circuit 8 outputs the pulse voltage signal Sp which maintains the high-level state during a time proportional to the output value acm of the accumulator 6 from a time when the reset signal Reset is input, as in the case of the above described embodiment, and thus, the output current Isc is output from the constant current circuit 9 during this time as shown in FIG. 7(E). According to this embodiment, it is unnecessary to provide an independent circuit for generating the reset signal Reset because the comparison signal fp is used as it is as the reset signal Reset, and the circuit construction is simple.

In the above description, six embodiments were described for the circuit which inputs the spurious signal cancelling reference signal fs to the pulse forming circuit 8, and two embodiments were described for the circuit which inputs the reset signal Reset to the pulse forming circuit 8. Since the circuit for inputting the spurious signal cancelling reference signal fs and the circuit for inputting the reset signal Reset are mutually independent, it is possible to freely combine one of the first through sixth embodiments and one of the seventh and eighth embodiments. A description will hereinafter be made with respect to two embodiments of such a combination.

Figure 20:
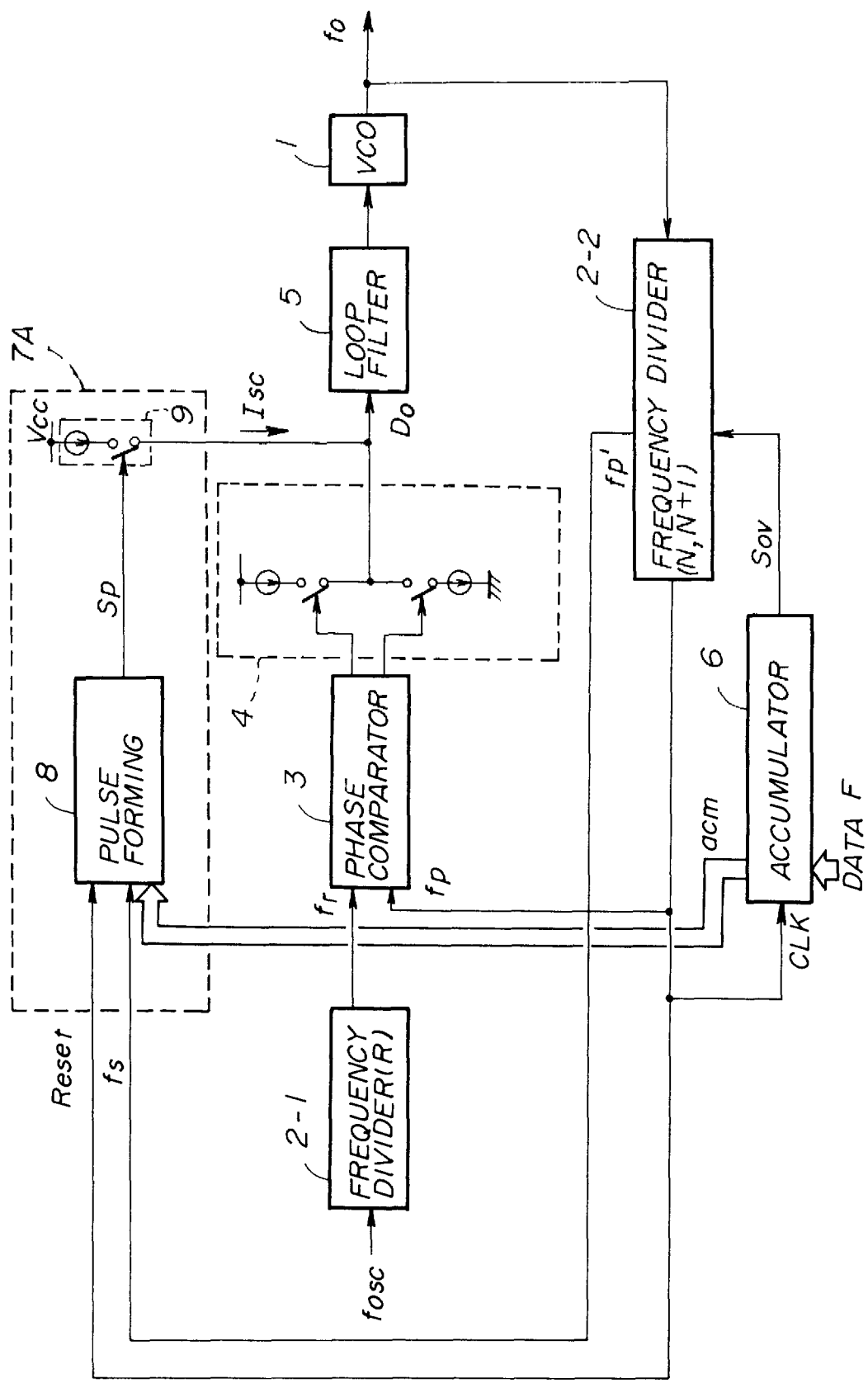
FIG. 20 is a system block diagram showing a ninth embodiment of the fractional N-frequency synthesizer according to the present invention.

FIG. 20 is a system block diagram showing a ninth embodiment of the fractional N-frequency synthesizer according to the present invention. In FIG. 20, those parts which are the same as those corresponding parts in FIG. 6A are designated by the same reference numerals, and a description thereof will be omitted.

In this embodiment, the signal fp' which is obtained from the intermediate terminal of the frequency divider 2-2 which generates the comparison signal fp, is used as the spurious signal cancelling reference signal fs. In addition, the comparison signal fp is used as the reset signal Reset. According to this embodiment, it is unnecessary to provide independent circuits for generating the spurious signal cancelling reference signal fs and the reset signal Reset, and the circuit construction is simple.

Figure 21:
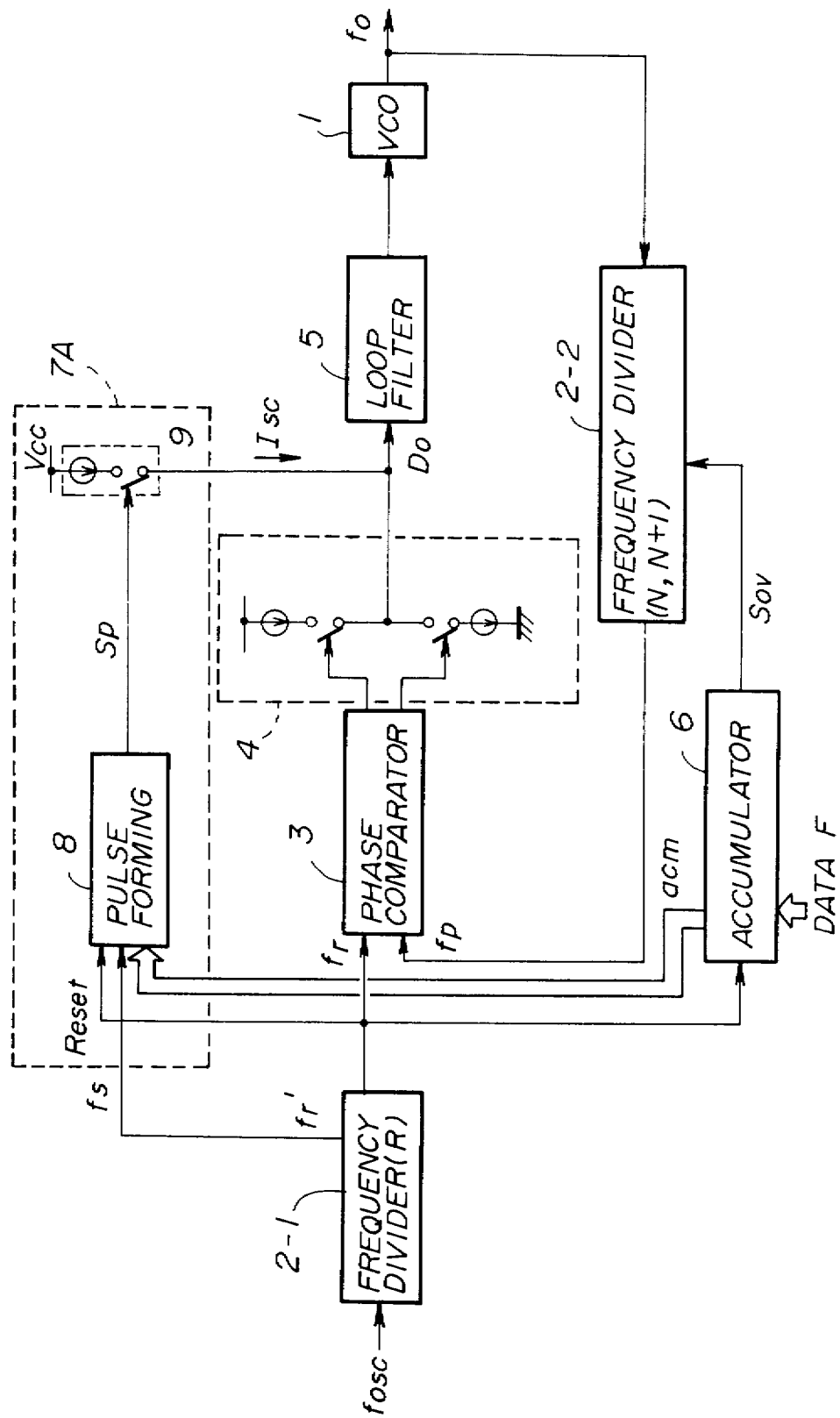
FIG. 21 is a system block diagram showing a tenth embodiment of the fractional N-frequency synthesizer according to the present invention.

FIG. 21 is a system block diagram showing a tenth embodiment of the fractional N-frequency synthesizer according to the present invention. In FIG. 21, those parts which are the same as those corresponding parts in FIG. 6A are designated by the same reference numerals, and a description thereof will be omitted.

In this embodiment, the signal fr' obtained from the intermediate terminal of the frequency divider 2-1 which generates the reference signal fr, is used as the spurious signal cancelling reference signal fs. In addition, the reference signal fr is used as the reset signal Reset. According to this embodiment, it is unnecessary to provide independent circuits for generating the spurious signal cancelling reference signal fs and the reset signal Reset, and the circuit construction is simple.

Next, a description will be given of the constant current circuit 9 of the spurious signal cancel circuit 7A.

Figure 22:
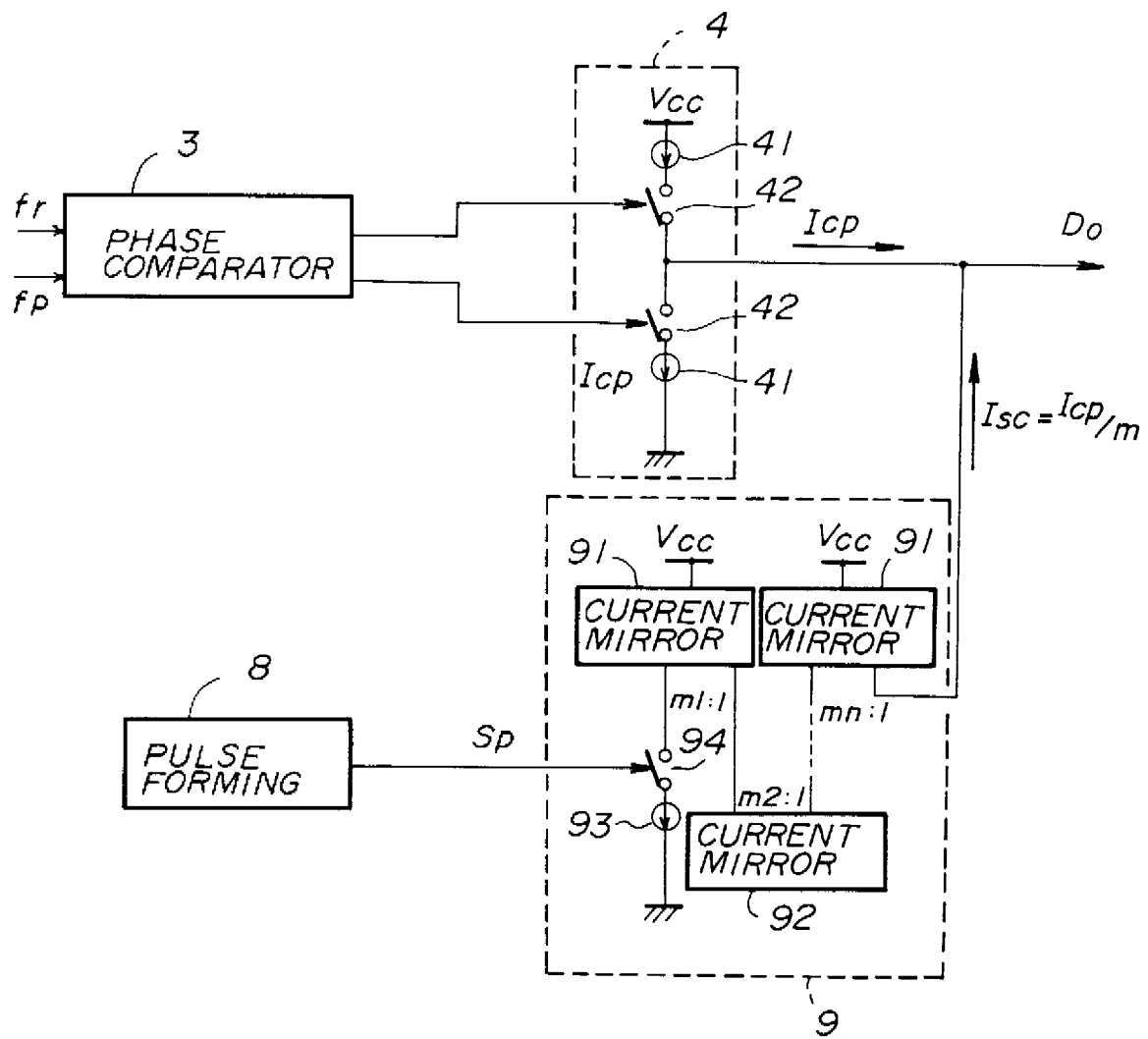
FIG. 22 is a system block diagram for explaining a first operating principle of a constant current circuit.
Figure 23:
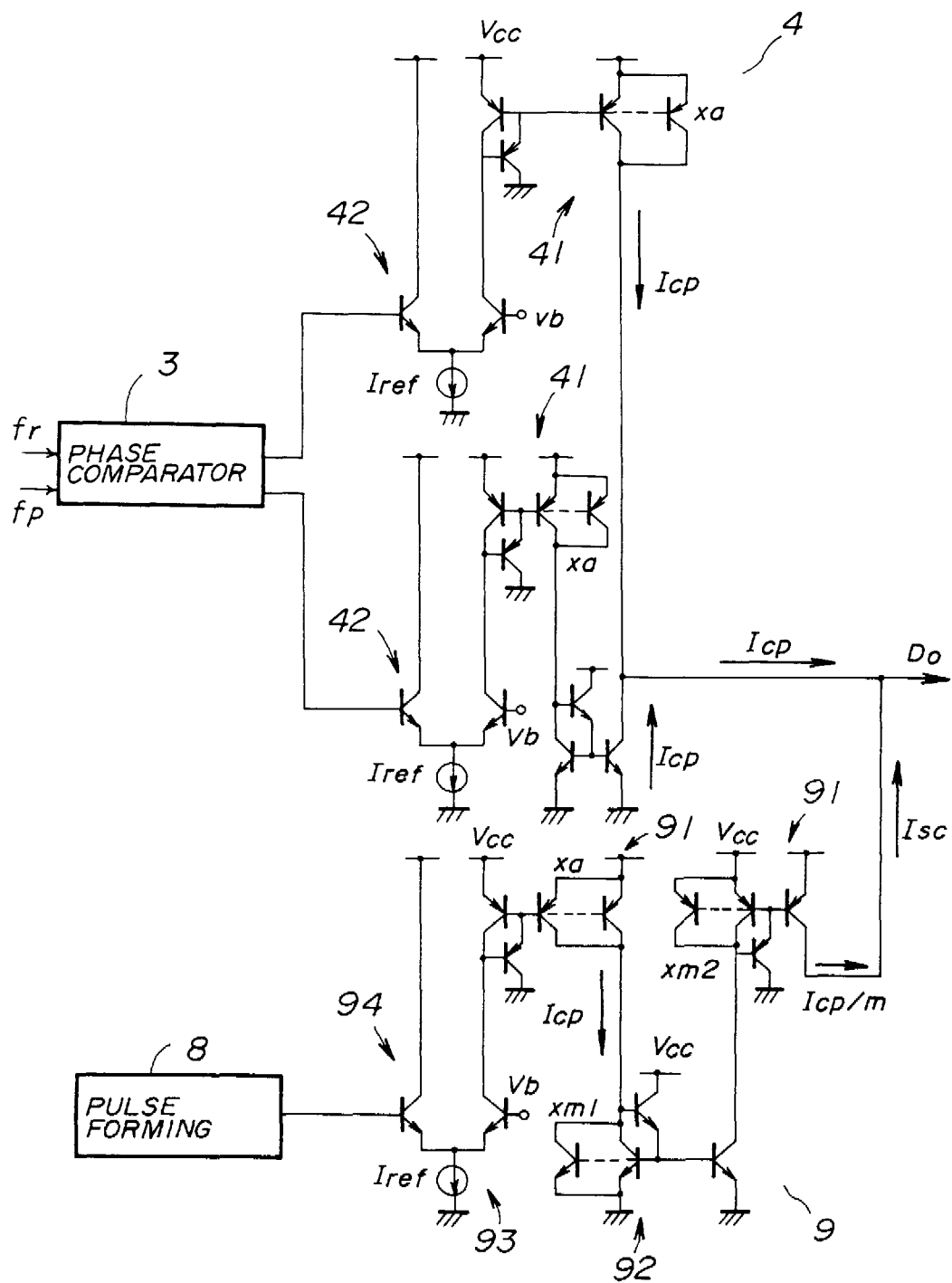
FIG. 23 is a circuit diagram showing a first embodiment of the constant current circuit.

FIG. 22 is a system block diagram for explaining a first operating principle of the constant current circuit 9 in comparison with the charge pump circuit 4. In addition, FIG. 23 is a circuit diagram showing a first embodiment of the constant current circuit 9. In FIGS. 22 and 23, those parts which are the same as those corresponding parts in FIG. 6A are designated by the same reference numerals, and a description thereof will be omitted.

As shown in FIGS. 22 and 23, the constant current circuit 9 includes a total of n PNP type current mirror circuits 91 and NPN type current mirror circuits 92 which are alternately combined, a reference current source 93, and a switch 94 which is driven and controlled by the pulse forming circuit 8, where n=1, 3, 5, . . . The pulse voltage signal Sp output from the pulse forming circuit 8 turns ON the switch 94, and the reference current source 93 flows a reference current to the PNP type current mirror circuit 91 at the first stage. The reference current is multiplied by 1/m by the total of n current mirror circuits, and the output current Isc of the spurious signal cancel circuit 7A is obtained from the PNP type current mirror circuit 91 provided at the last stage. This output current Isc of the spurious signal cancel circuit 7A is superimposed on the output current Icp of the charge pump circuit 4, thereby producing the output current Do which is supplied to the loop filter 5.

The reference current source 93 of the constant current circuit 9 and the reference current source 41 of the charge pump circuit 4 are made to have the same construction, and the switch 94 of the constant current circuit 9 and the switch 42 of the charge pump circuit 4 are made to have the same construction. As a result, the reference current value of the constant current circuit 9 and the reference current value of the charge pump circuit 4 become the same, such that the output current Isc which is obtained by multiplying 1/m to the reference current value of the constant current circuit 9 becomes 1/m times the output current Icp of the charge pump circuit 4. Accordingly, even if the power supply voltage Vcc fluctuates or a temperature change occurs and the value of the output current Isc of the spurious signal cancel circuit 7A and the value of the output current Icp of the charge pump circuit 4 change, the ratio between the two is always maintained to 1:m. Consequently, a stable spurious signal cancelling effect is obtained.

Figure 24:
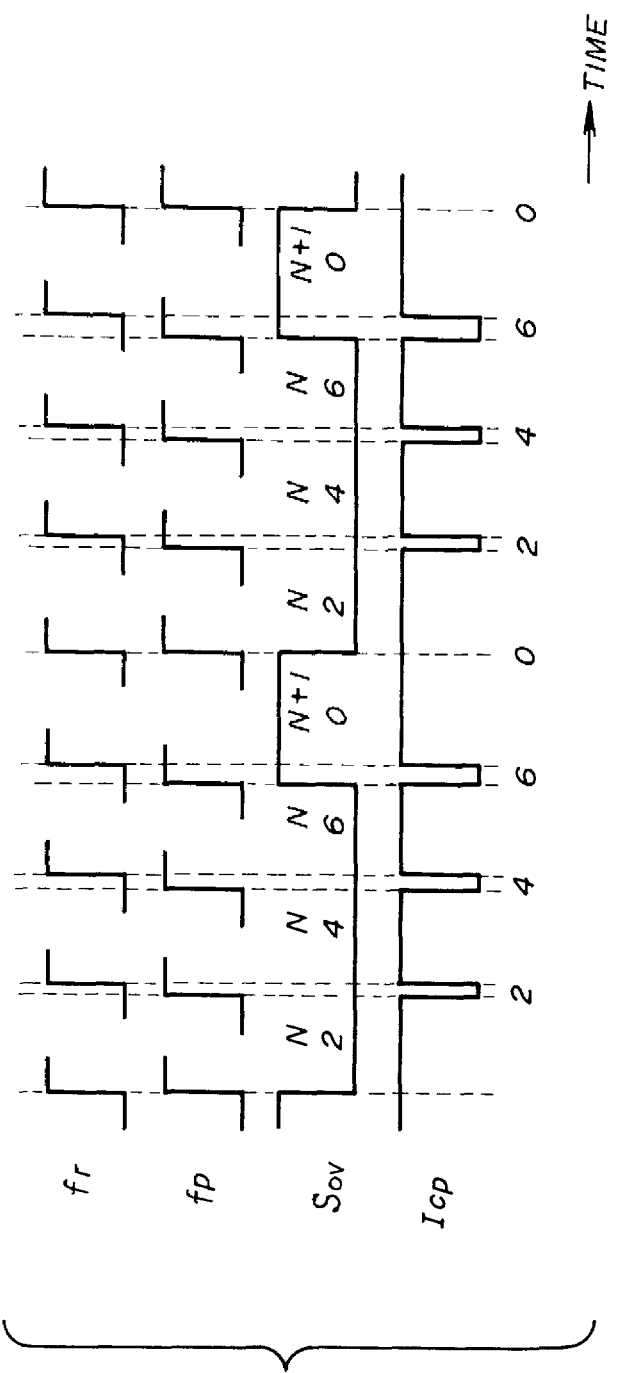
FIG. 24 is a timing chart for explaining the spurious signal cancel process for a case where a data F is added.
Figure 25:
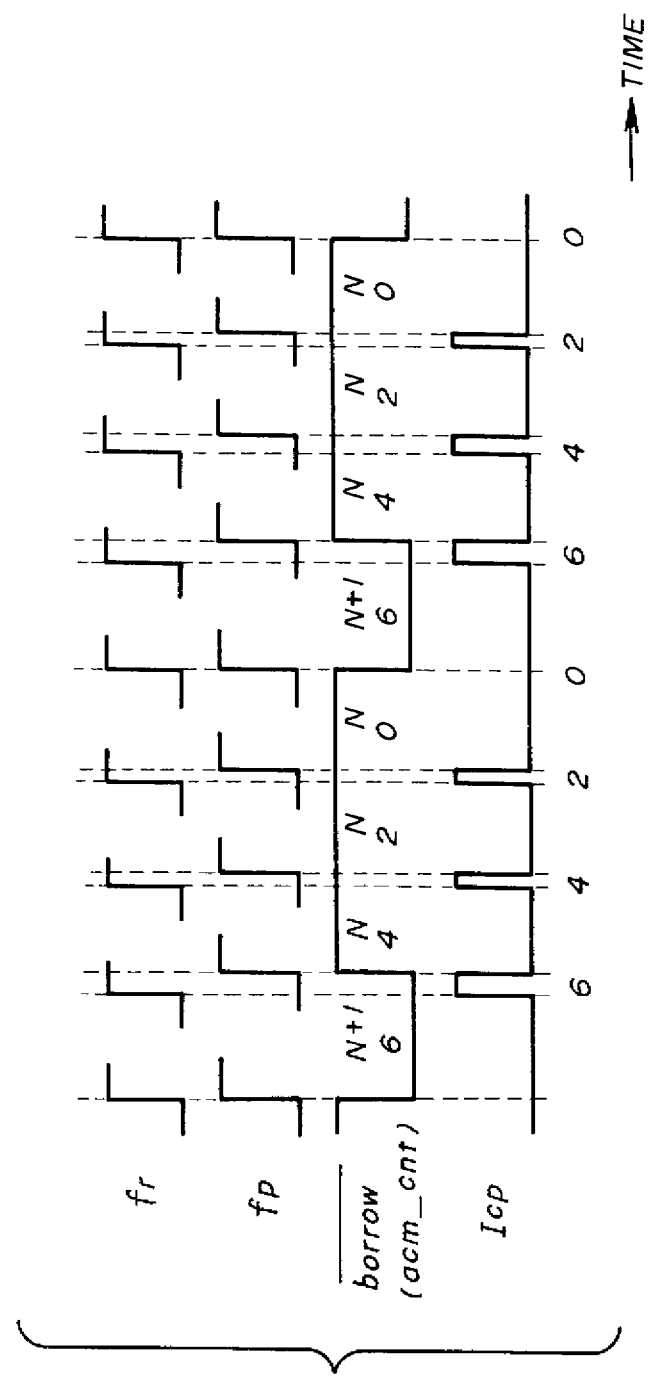
FIG. 25 is a timing chart for explaining the spurious signal cancel process for a case where the data F is subtracted.

As described above in conjunction with FIGS. 7(A) through 7(F), it was a precondition in each of the embodiments described above that the held value acm of the accumulator 6 is added as shown in FIG. 24. However, it is possible to subtract the held value acm of the accumulator 6, as shown in FIG. 25. In this case, the output current Icp of the charge pump circuit 4 at the time of the lock-up is on the pump-out side.

Figure 26:
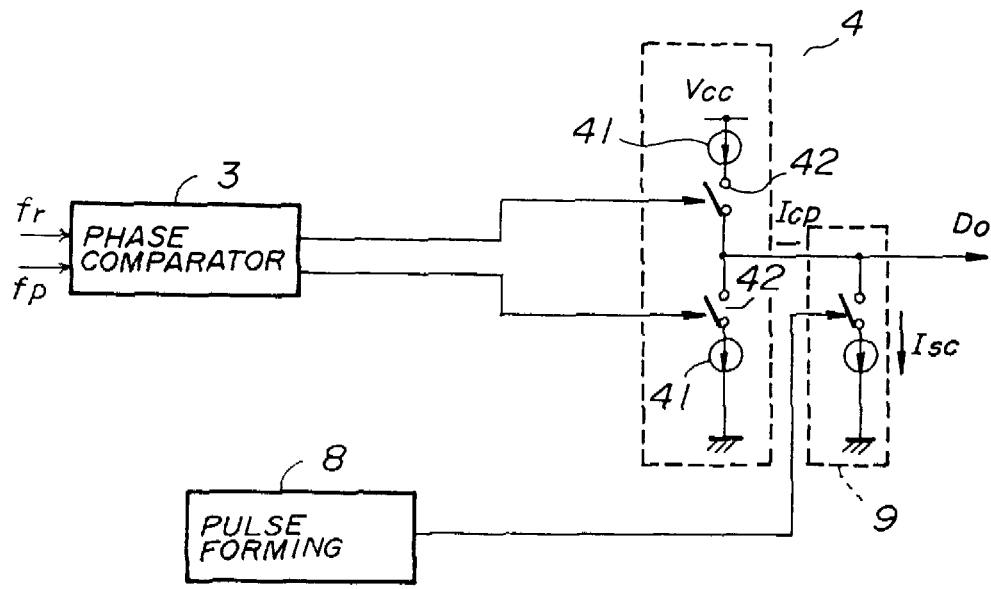
FIGS. 26 and 27 respectively are system block diagrams for explaining a second operating principle of the constant current circuit.
Figure 27:
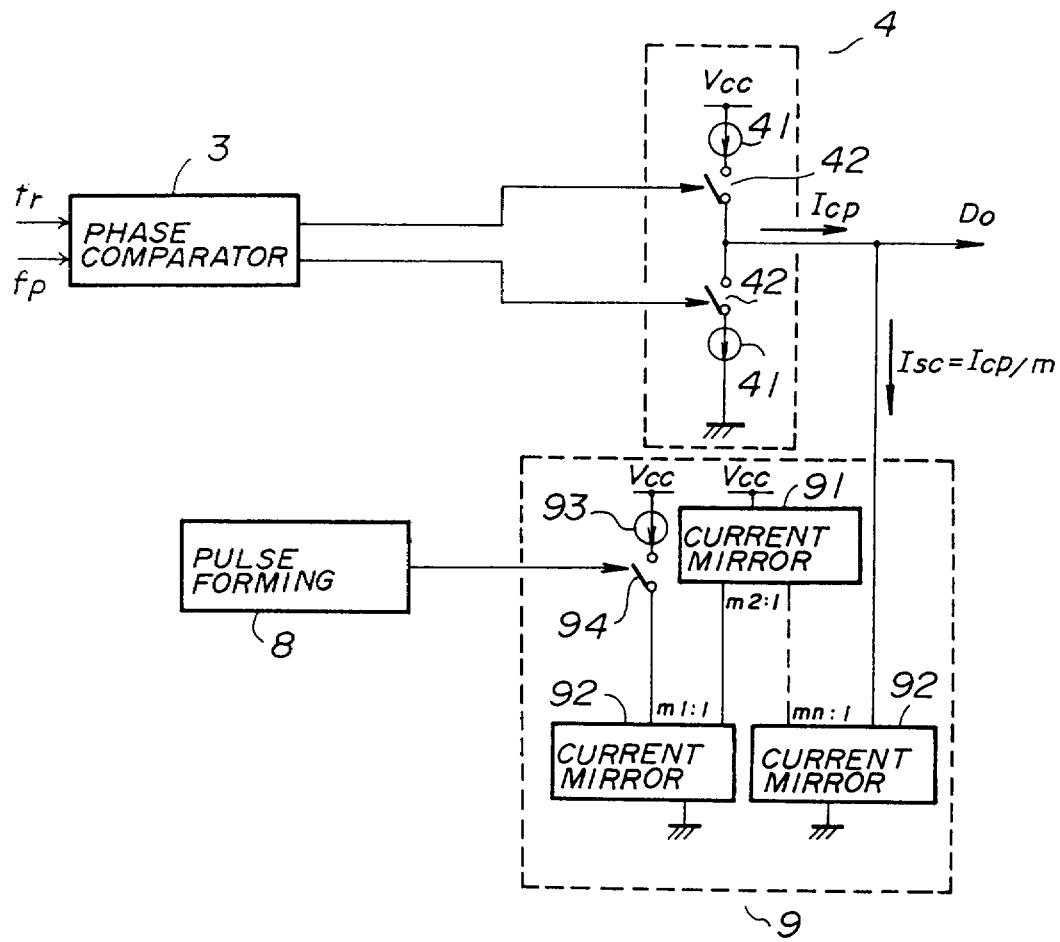
Figure 28:
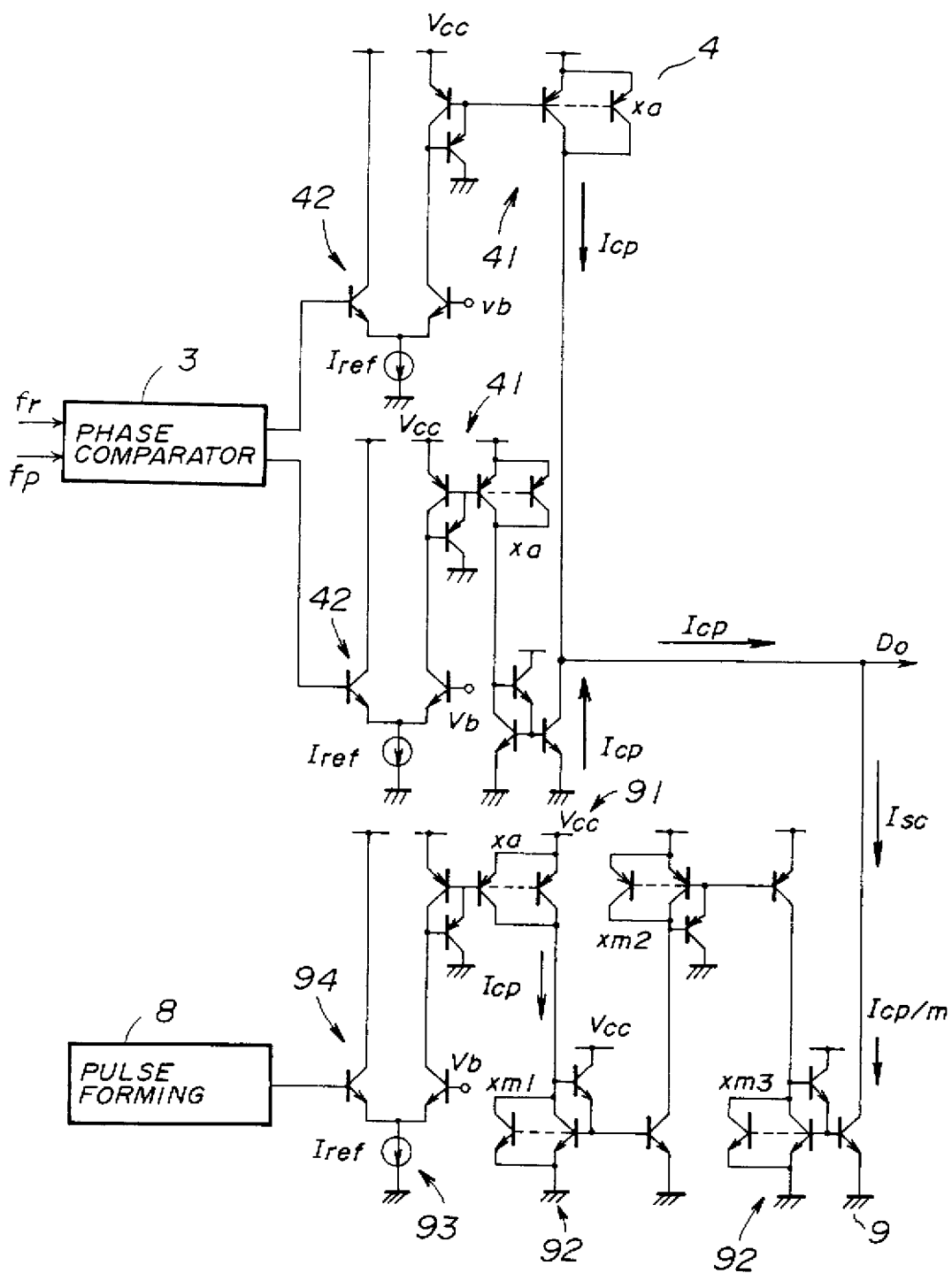
FIG. 28 is a circuit diagram showing a second embodiment of the constant current circuit.

FIGS. 26 and 27 respectively are system block diagrams for explaining a second operating principle of the constant current circuit 9 for the case where the held value acm of the accumulator 6 is subtracted. In addition, FIG. 28 is a circuit diagram showing a second embodiment of the constant current circuit 9. In FIGS. 26 through 28, those parts which are the same as those corresponding parts in FIGS. 22 and 23 are designated by the same reference numerals, and a description thereof will be omitted.

In this case, the output current Isc of the spurious signal cancel circuit 7A becomes a pump-in current as shown in FIG. 26. Hence, as shown in FIGS. 27 and 28, an NPN type current mirror circuit 92 is provided at the last stage of the constant current circuit 9. In this embodiment, one of the n current mirror circuits of the constant current circuit 9, which outputs a smallest current and is provided at the last stage, is formed by the NPN type current mirror circuit 92 which is made up of NPN type transistors. For this reason, it is possible to turn the output current Isc of the spurious signal cancel 7A ON and OFF at a high speed.

In the embodiments described above, the PNP type current mirror circuit 91 and the NPN type current mirror circuit 92 use bipolar transistors. However, similar effects can be obtained using other types of transistors such as MOS-FETs to form a PMOS type current mirror circuit and a NMOS type current mirror circuit and the like, for example. Accordingly, the present invention is not limited to the case where the current mirror circuit using the bipolar transistors is used.

Figure 29:
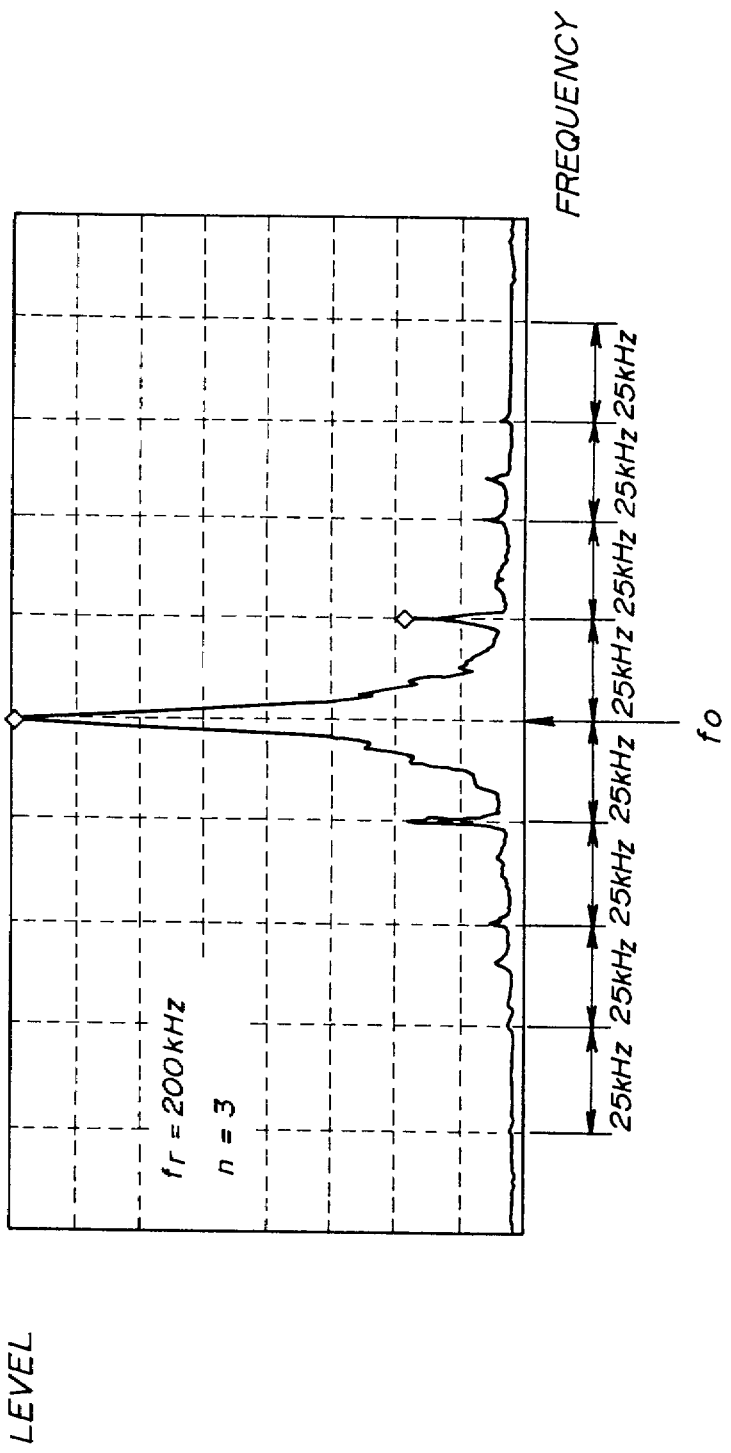
FIG. 29 is a diagram showing a frequency spectrum of an output signal of a VCO in the present invention.

FIG. 29 is a diagram showing a frequency spectrum of the output signal fo of the VCO 1 measured in the present invention. In FIG. 29, the ordinate indicates the level in arbitrary units, and the abscissa indicates the frequency. As may be seen by comparing FIGS. 29 and 3, the spurious signals are essentially cancelled in their entirety according to the present invention.

Figure 30:
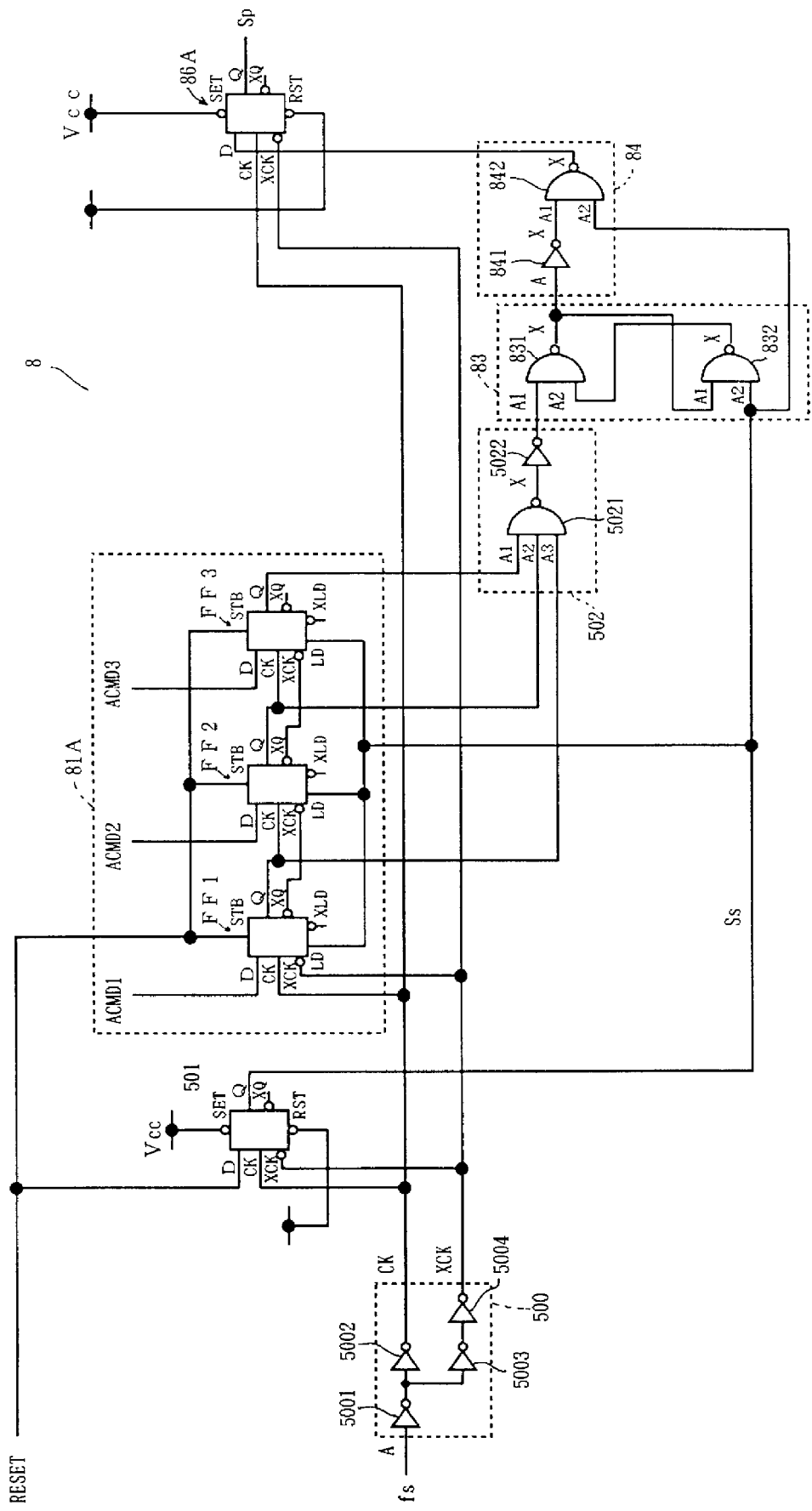
FIG. 30 is a circuit diagram showing a fourth embodiment of the pulse forming circuit.

Next, a description will be given of a fourth embodiment of the pulse forming circuit 8. FIG. 30 is a circuit diagram showing the third embodiment of the pulse forming circuit 8. In FIG. 30, those parts which are the same as those corresponding parts in FIG. 11 are designated by the same reference numerals, and a description thereof will be omitted.

In the pulse forming circuit 8 shown in FIG. 30, a down-counter part 81A, a timing circuit 500, a delay (D) flip-flop 501, and a "0" detection circuit are provided in place of the counter part 81 and the logic circuit part 82 shown in FIG. 11. Further, a D flip-flop 86A is provided in place of the D flip-flop 86 shown in FIG. 11.

The down-counter part 81A includes flip-flops FF1 through FF3 which are connected as shown and respectively receive corresponding bits ACMD1 through ACMD3 of a 3-bit accumulator output value. This down-counter part 81A sets the counter value to the accumulator output value in response to a signal Ss output from the D flip-flop 501. The timing circuit 500 includes inverters 5001 through 5004 which are connected as shown, and adjusts the timing of the spurious signal cancelling reference signal fs. The "0" detection circuit 502 includes a NAND circuit 5021 and an inverter 5022 which are connected as shown.

According to the pulse forming circuit 8 shown in FIG. 30, the accumulator output value is set in advance in the down-counter part 81A, and the pulse voltage signal Sp is output while a down-count is made until the counted value becomes "0". As a result, it is possible to realize a high-speed operation as compared to the above described embodiments of the pulse forming circuit 8 shown in FIGS. 9 through 11.

Further, the present invention is not limited to these embodiments, but various variations and modifications may be made without departing from the scope of the present invention.

What is claimed is:

1. A fractional N-frequency synthesizer comprising:
   an accumulator outputting an output value; and
   a spurious signal cancel circuit comprising:
   a pulse forming circuit, receiving a spurious signal cancelling reference signal, a reset signal and the output value of said accumulator, and outputting, in synchronism with the spurious signal cancelling reference signal, a pulse voltage signal having a pulse width proportional to the output value of the accumulator from a time when the reset signal is received; and
   a constant current circuit controlled by the pulse voltage signal and outputting an output current of said spurious signal cancel circuit.

2. The fractional N-frequency synthesizer as claimed in claim 1, wherein said pulse forming circuit comprises:
   a counter part, receiving the spurious signal cancelling reference signal and the reset signal, and counting the spurious signal cancelling reference signal from a time when the reset signal is received;
   a logic circuit part, receiving the output value of said accumulator and a counted value of said counter part, and outputting a match detection signal when the output value of said accumulator matches the counted value of said counter part;
   a latch circuit part set responsive to the reset signal and reset responsive to the match detection signal; and
   an output part, receiving the reset signal and an output signal of said latch circuit part, and outputting the pulse voltage signal from a time when the reset signal is received until a time when the output signal of the latch circuit part is inverted.

3. The fractional N-frequency synthesizer as claimed in claim 2, wherein said counter part is made up of one of an asynchronous counter and a synchronous counter, said asynchronous counter comprising a plurality of flip-flops.

4. The fractional N-frequency synthesizer as claimed in claim 2, wherein said pulse forming circuit further comprises:
   a synchronizing flip-flop, receiving the pulse voltage signal output from said output part, and outputting the pulse voltage signal as an output of said pulse forming circuit in synchronism with the spurious signal cancelling reference signal.

5. The fractional N-frequency synthesizer as claimed in claim 1, which further comprises:
   a voltage controlled oscillator outputting an output signal of the fractional N-frequency synthesizer,
   said pulse forming circuit receiving a signal derived from the output signal of said voltage controlled oscillator as the spurious signal cancelling reference signal.

6. The fractional N-frequency synthesizer as claimed in claim 5, which further comprises:
   a frequency divider generating a comparison signal based on the output signal of said voltage controlled oscillator; and
   a phase comparator receiving the comparison signal,
   said pulse forming circuit receiving as the spurious signal cancelling reference signal a signal obtained from an intermediate terminal of said frequency divider.

7. The fractional N-frequency synthesizer as claimed in claim 1, which further comprises:
   a first frequency divider generating a comparison signal based on the output signal of said voltage controlled oscillator;
   a phase comparator receiving the comparison signal; and
   a second frequency divider outputting a signal based on the output signal of said voltage controlled oscillator,
   said pulse forming circuit receiving as the spurious signal cancelling reference signal the output signal of said second frequency divider.

8. The fractional N-frequency synthesizer as claimed in claim 1, which further comprises:
   a frequency divider generating a reference signal based on a source reference signal; and
   a phase comparator receiving the reference signal,
   said pulse forming circuit receiving the source reference signal as the spurious signal cancelling reference signal.

9. The fractional N-frequency synthesizer as claimed in claim 1, which further comprises:
   a frequency divider generating a reference signal based on a source reference signal; and
   a phase comparator receiving the reference signal,
   said pulse forming circuit receiving as the spurious signal cancelling reference signal a signal which is obtained from an intermediate terminal of said frequency divider.

10. The fractional N-frequency synthesizer as claimed in claim 1, which further comprises:
    a voltage controlled oscillator outputting an output signal of the fractional N-frequency synthesizer; and
    a frequency multiplier multiplying by a multiplying factor the frequency of the output signal of said voltage controlled oscillator,
    said pulse forming circuit receiving as the spurious signal cancelling reference signal an output signal of said frequency multiplier.

11. The fractional N-frequency synthesizer as claimed in claim 1, which further comprises:
    a phase comparator receiving a reference signal,
    said pulse forming circuit receiving as the reset signal the reference signal or a signal having the same period as the reference signal.

12. The fractional N-frequency synthesizer as claimed in claim 1, which further comprises:
a phase comparator receiving a comparison signal,
said pulse forming circuit receiving as the reset signal the comparison signal or a signal having the same period as the comparison signal.

13. The fractional N-frequency synthesizer as claimed in claim 1, wherein said constant current circuit comprises:
a reference current source controlled by the pulse voltage signal from said pulse forming circuit; and
one or a plurality of current mirror circuits coupled in series, outputting the output current of said spurious signal cancel circuit by multiplying by 1/m a current value obtained from said reference current source.

14. The fractional N-frequency synthesizer as claimed in claim 13, which further comprises:
a charge pump circuit having a reference current source,
said reference current source of said constant current circuit having approximately the same characteristic as the reference current source of said charge pump circuit.

15. The fractional N-frequency synthesizer as claimed in claim 13, wherein the one or plurality of current mirror circuits of said constant current circuit include a PNP type current mirror circuit or a plurality of alternately coupled PNP type current mirror circuits and NPN type current mirror circuits, a PNP type current mirror circuit located at a last stage outputting a pump-out current as the output current of said spurious signal cancel circuit.

16. The fractional N-frequency synthesizer as claimed in claim 13, wherein the one or plurality of current mirror circuits of said constant current circuit include a PMOS type current mirror circuit or a plurality of alternately coupled PMOS type current mirror circuits and NMOS type current mirror circuits, a PMOS type current mirror circuit located at a last stage outputting a pump-out current as the output current of said spurious signal cancel circuit.

17. The fractional N-frequency synthesizer as claimed in claim 13, wherein the one or plurality of current mirror circuits of said constant current circuit include a NPN type current mirror circuit or a plurality of alternately coupled PNP type current mirror circuits and NPN type current mirror circuits, a NPN type current mirror circuit located at a last stage outputting a pump-in current as the output current of said spurious signal cancel circuit.

18. The fractional N-frequency synthesizer as claimed in claim 13, wherein the one or plurality of current mirror circuits of said constant current circuit include a NMOS type current mirror circuit or a plurality of alternately coupled PMOS type current mirror circuits and NMOS type current mirror circuits, a NMOS type current mirror circuit located at a last stage outputting a pump-in current as the output current of said spurious signal cancel circuit.

19. The fractional N-frequency synthesizer as claimed in claim 1, which further comprises:
a charge pump circuit outputting an output current,
the output current of said spurious signal cancel circuit being added to the output current of said charge pump circuit.

20. A spurious signal cancel circuit for a fractional N-frequency synthesizer which includes an accumulator outputting an output value, said spurious signal cancel circuit comprising:
a pulse forming circuit, receiving a spurious signal cancelling reference signal, a reset signal and the output value of said accumulator, and outputting, in synchronism with the spurious signal cancelling reference signal, a pulse voltage signal having a pulse width proportional to the output value of the accumulator from a time when the reset signal is received; and
a constant current circuit controlled by the pulse voltage signal and outputting an output current of said spurious signal cancel circuit.

21. The spurious signal cancel circuit as claimed in claim 20, wherein said pulse forming circuit comprises:
a counter part, receiving the spurious signal cancelling reference signal and the reset signal, and counting the spurious signal cancelling reference signal from a time when the reset signal is received;
a logic circuit part, receiving the output value of the accumulator and a counted value of said counter part, and outputting a match detection signal when the output value of the accumulator matches the counted value of said counter part;
a latch circuit part set responsive to the reset signal and reset responsive to the match detection signal; and
an output part, receiving the reset signal and an output signal of said latch circuit part, and outputting the pulse voltage signal from a time when the reset signal is received until a time when the output signal of the latch circuit part is inverted.

22. The spurious signal cancel circuit as claimed in claim 21, wherein said counter part is made up of one of an asynchronous counter and a synchronous counter, said asynchronous counter comprising a plurality of flip-flops.

23. The spurious signal cancel circuit as claimed in claim 21, wherein said pulse forming circuit further comprises:
a synchronizing flip-flop, receiving the pulse voltage signal output from said output part, and outputting the pulse voltage signal as an output of said pulse forming circuit in synchronism with the spurious signal cancelling reference signal.

24. The spurious signal cancel circuit as claimed in claim 20, wherein said pulse forming circuit receives an output signal of the the fractional N-frequency synthesizer as the spurious signal cancelling reference signal.

25. The spurious signal cancel circuit as claimed in claim 20, wherein said constant current circuit comprises:
a reference current source controlled by the pulse voltage signal from said pulse forming circuit; and
one or a plurality of current mirror circuits coupled in series, outputting the output current of said spurious signal cancel circuit by multiplying by 1/m a current value obtained from said reference current source.

26. The spurious signal cancel circuit as claimed in claim 25, wherein the one or plurality of current mirror circuits of said constant current circuit include a PNP type current mirror circuit or a plurality of alternately coupled PNP type current mirror circuits and NPN type current mirror circuits, a PNP type current mirror circuit located at a last stage outputting a pump-out current as the output current of said spurious signal cancel circuit.

27. The spurious signal cancel circuit as claimed in claim 25, wherein the one or plurality of current mirror circuits of said constant current circuit include a PMOS type current mirror circuit or a plurality of alternately coupled PMOS type current mirror circuits and NMOS type current mirror circuits, a PMOS type current mirror circuit located at a last stage outputting a pump-out current as the output current of said spurious signal cancel circuit.

28. The spurious signal cancel circuit as claimed in claim 25, wherein the one or plurality of current mirror circuits of said constant current circuit include a NPN type current mirror circuit or a plurality of alternately coupled PNP type current mirror circuits and NPN type current mirror circuits, a NPN type current mirror circuit located at a last stage outputting a pump-in current as the output current of said spurious signal cancel circuit.

29. The spurious signal cancel circuit as claimed in claim 25, wherein the one or plurality of current mirror circuits of said constant current circuit include a NMOS type current mirror circuit or a plurality of alternately coupled PMOS type current mirror circuits and NMOS type current mirror circuits, a NMOS type current mirror circuit located at a last stage outputting a pump-in current as the output current of said spurious signal cancel circuit.

30. The spurious signal cancel circuit as claimed in claim 20, wherein:

said constant current circuit comprises:

a reference current source controlled by the pulse voltage signal from said pulse forming circuit; and one or a plurality of current mirror circuits coupled in series, outputting the output current of said spurious signal cancel circuit by multiplying by 1/m a current value obtained from said reference current source, and said spurious signal cancel circuit further comprises:

a charge pump circuit having a reference current source, said reference current source of said constant current circuit having approximately the same characteristic as the reference current source of said charge pump circuit.

* * * * *